United States Patent
Lee et al.

(10) Patent No.: US 12,207,471 B2
(45) Date of Patent: Jan. 21, 2025

(54) SEMICONDUCTOR MEMORY DEVICE

(71) Applicant: Samsung Electronics Co., Ltd., Suwon-si (KR)

(72) Inventors: Hae-Min Lee, Seoul (KR); Kwang-Soo Kim, Hwaseong-si (KR); Sun-Il Shim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 727 days.

(21) Appl. No.: 17/459,887

(22) Filed: Aug. 27, 2021

(65) Prior Publication Data

US 2021/0391340 A1    Dec. 16, 2021

Related U.S. Application Data

(63) Continuation of application No. 16/565,579, filed on Sep. 10, 2019, now Pat. No. 11,107,826.

(30) Foreign Application Priority Data

Mar. 7, 2019    (KR) .................. 10-2019-0026325

(51) Int. Cl.
*H10B 43/35*    (2023.01)
*G11C 5/06*    (2006.01)
(Continued)

(52) U.S. Cl.
CPC ............. *H10B 43/35* (2023.02); *G11C 5/063* (2013.01); *H01L 23/5226* (2013.01);
(Continued)

(58) Field of Classification Search
CPC . G11C 16/0483; G11C 5/063; H01L 23/5226; H01L 29/792; H10B 41/27;
(Continued)

(56) References Cited

U.S. PATENT DOCUMENTS 8,319,275 B2    11/2012    Shim et al.
8,476,713 B2    7/2013    Lee et al.
(Continued)

FOREIGN PATENT DOCUMENTS

CN    101814508 A    8/2010
CN    107731823 A    2/2018
(Continued)

OTHER PUBLICATIONS

Notice of Allowance dated Jun. 25, 2024 for corresponding KR Patent Application No. 10-2019-0026325.

*Primary Examiner* — Michelle Mandala
*Assistant Examiner* — Kevin Quinto
(74) *Attorney, Agent, or Firm* — Muir Patent Law, PLLC

(57) ABSTRACT

A semiconductor memory device includes gate electrodes arranged on a substrate to be spaced apart from each other in a first direction perpendicular to an upper surface of the substrate, an upper insulation layer arranged on an uppermost gate electrode, channel structures penetrating through the upper insulation layer, and the gate electrodes in the first direction, and string selection line cut insulation layers horizontally separating the upper insulation layer and the uppermost gate electrode. Each of the string selection line cut insulation layers includes a protrusion protruding toward the uppermost gate electrode and positioning on the same level as the first gate electrode.

19 Claims, 26 Drawing Sheets

(51) Int. Cl.
*H01L 23/522* (2006.01)
*H10B 41/27* (2023.01)
*H10B 41/35* (2023.01)
*H10B 43/27* (2023.01)

(52) U.S. Cl.
CPC ............. *H10B 41/27* (2023.02); *H10B 41/35* (2023.02); *H10B 43/27* (2023.02)

(58) Field of Classification Search
CPC ........ H10B 41/35; H10B 43/27; H10B 43/35; H10B 43/40
See application file for complete search history.

(56) References Cited

U.S. PATENT DOCUMENTS

| | | |
|---|---|---|
| 8,953,376 B2 | 2/2015 | Nam et al. |
| 9,691,782 B1 | 6/2017 | Hwang et al. |
| 10,134,752 B2 | 11/2018 | Kim et al. |
| 10,453,745 B2 | 10/2019 | Choi et al. |
| 2001/0053602 A1* | 12/2001 | Lee .................. H01L 21/76825 257/E21.271 |
| 2007/0230249 A1 | 10/2007 | Miyaki .................. G11C 16/26 365/185.22 |
| 2013/0134493 A1* | 5/2013 | Eom ................... H01L 29/7926 257/314 |
| 2016/0329340 A1 | 11/2016 | Hwang et al. |
| 2017/0062472 A1 | 3/2017 | Park et al. |
| 2017/0077108 A1 | 3/2017 | Kawaguchi et al. |
| 2018/0138193 A1 | 5/2018 | Zhang et al. |
| 2018/0308856 A1 | 10/2018 | Cho et al. |
| 2018/0337054 A1 | 11/2018 | Sung et al. |
| 2019/0067323 A1 | 2/2019 | Xu et al. |

FOREIGN PATENT DOCUMENTS

| | | |
|---|---|---|
| CN | 107968092 A | 4/2018 |
| CN | 108461498 A | 8/2018 |
| KR | 1020130059821 A | 6/2013 |
| KR | 1020160131458 A | 11/2016 |
| KR | 1020170014033 A | 2/2017 |

\* cited by examiner

SEMICONDUCTOR MEMORY DEVICE

CROSS-REFERENCE TO RELATED APPLICATION

This application is a continuation of and claims priority to U.S. patent application Ser. No. 16/565,579 filed on Sep. 10, 2019, which claims the benefit of Korean Patent Application No. 10-2019-0026325, filed on Mar. 7, 2019, in the Korean Intellectual Property Office, the disclosure of each of which is incorporated here in its entirety by reference.

BACKGROUND

The inventive concept relates to semiconductor memory devices. More particularly, the inventive concept relates to a semiconductor memory device having an increased degree of integration.

Multifunctional information and/or communication devices demand large capacity and high integration of memory devices. Accordingly, memory devices having a high integration density and good electrical characteristics are desired.

SUMMARY

The inventive concept provides a semiconductor memory device having an increased degree of integration and increased reliability, and a method of fabricating the semiconductor memory device.

Additional aspects will be set forth in part in the description which follows and, in part, will be apparent from the description, or may be learned by practice of the presented embodiments.

According to an exemplary embodiment of the inventive concept, a semiconductor memory device includes a plurality of gate electrodes arranged on a substrate to be spaced apart from each other in a first direction perpendicular to an upper surface of the substrate, a plurality of insulation layers arranged between the plurality of gate electrodes, an upper insulation layer arranged on an uppermost gate electrode of the plurality of gate electrodes, a plurality of channel structures penetrating through the upper insulation layer, the plurality of gate electrodes, and the plurality of insulation layers in the first direction, each including a plurality of layers and having a circular cross-section, and a plurality of string selection line cut insulation layers horizontally separating the upper insulation layer and the uppermost gate electrode. Each of the plurality of string selection line cut insulation layers includes a protrusion protruding toward the separated uppermost gate electrode and positioning on the same level as the separated first gate electrode.

According to an exemplary embodiment of the inventive concept, a semiconductor memory device includes a plurality of gate electrodes arranged on a substrate to be spaced apart from each other in a first direction perpendicular to an upper surface of the substrate, a plurality of insulation layers arranged between the plurality of gate electrodes, an upper insulation layer arranged on an uppermost gate electrode of the plurality of gate electrodes, a plurality of channel structures penetrating through the upper insulation layer, the plurality of gate electrodes, and the plurality of insulation layers in the first direction, each including a plurality of layers and having a circular cross-section, a pair of word line cuts separating the plurality of gate electrodes and the plurality of insulation layers in a second direction parallel to the upper surface of the substrate, and a plurality of string selection line cut insulation layers arranged between the pair of word line cuts and separating the upper insulation layer and the uppermost gate electrode in the second direction. Each of the plurality of string selection line cut insulation layers includes a sidewall spaced apart from a sidewall of the separated upper insulation layer.

According to an exemplary embodiment of the inventive concept, a semiconductor memory device includes a plurality of gate electrodes arranged on a substrate to be spaced apart from each other in a first direction perpendicular to an upper surface of the substrate, and including a gate conductive layer and a first barrier covering the gate conductive layer, each of the plurality of gate electrodes including at least one ground selection gate electrode arranged on the substrate, a plurality of word line gate electrodes arranged on the at least one ground selection gate electrode, and at least one string selection gate electrode arranged on the plurality of word line gate electrodes, a plurality of insulation layers arranged between the plurality of gate electrodes, an upper insulation layer arranged on the at least one string selection gate electrode, a plurality of channel structures penetrating through the upper insulation layer, the plurality of gate electrodes, and the plurality of insulation layers in the first direction, each including a plurality of layers and having a circular cross-section, a pair of word line cut insulation layers, the plurality of gate electrodes and the plurality of insulation layers being disposed between the pair of the word line cut insulation layers spaced apart from each other in a second direction parallel to the upper surface of the substrate, and a plurality of string selection line cut insulation layers arranged between the pair of word line cut insulation layers and separating the upper insulation layer and the at least one string selection gate electrode in the second direction. The first barrier layer included in the at least one string selection gate electrode is between the upper insulation layer and each of the string selection line cut insulation layers.

BRIEF DESCRIPTION OF THE DRAWINGS

Embodiments of the inventive concept will be more clearly understood from the following detailed description taken in conjunction with the accompanying drawings in which:

FIGS. 14B, 15B, 17B and 18B are plan views for explaining a method of manufacturing a semiconductor memory device, according to some other embodiments.

DETAILED DESCRIPTION OF THE EMBODIMENTS

Figure 1:
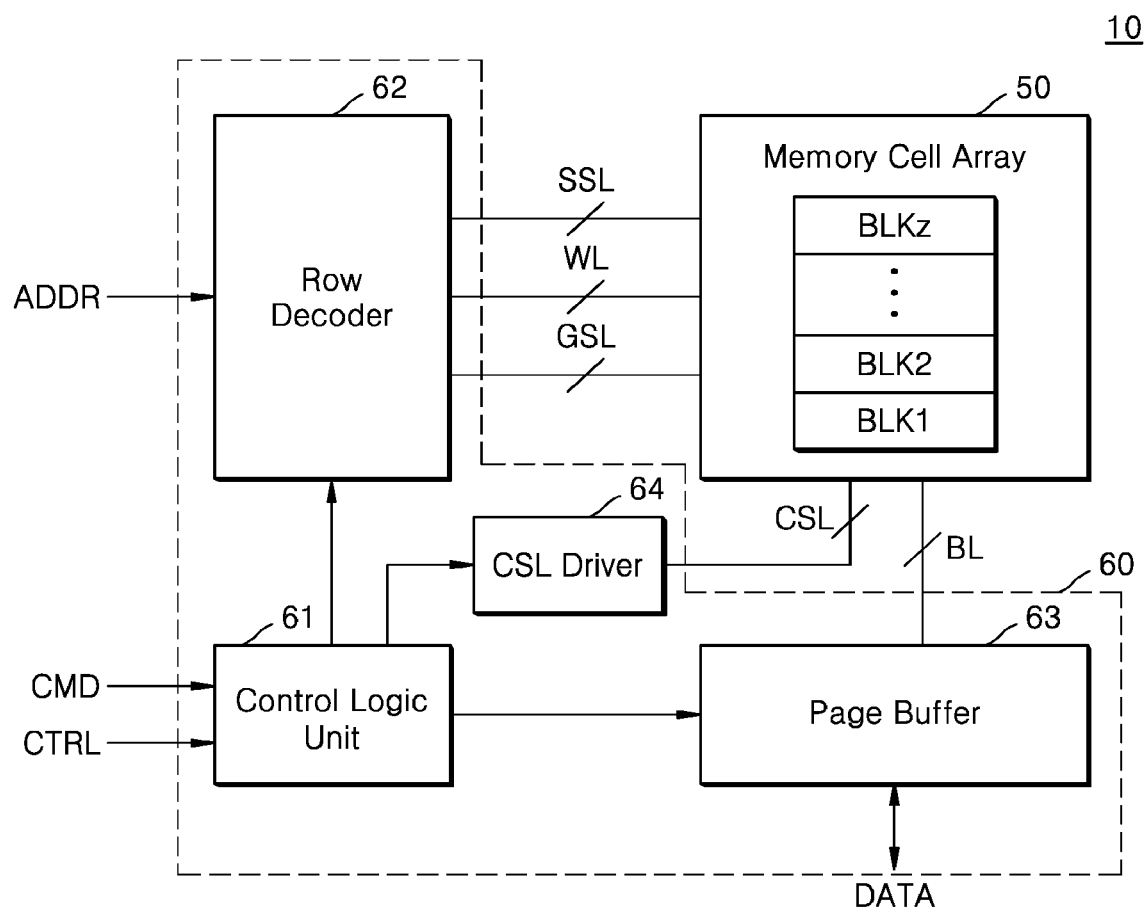
FIG. 1 is a block diagram of a semiconductor memory device according to some embodiments.

Embodiments will now be described more fully with reference to the accompanying drawings. In the accompanying drawings, like reference numerals may refer to like elements, and repeated descriptions of the like elements will be omitted. In the following drawings, the thickness or the size of each layer are exaggerated for convenience and clarity of description, and thus may be slightly different from the actual shape and ratio.

FIG. 1 is a block diagram of a semiconductor memory device 10 according to some embodiments.

Referring to FIG. 1, the semiconductor memory device 10 includes a memory cell array 50 and a peripheral circuit 60. According to some embodiments, the semiconductor memory device 10 may further include a data input/output (I/O) circuit or an I/O interface.

The memory cell array 50 is connected to string select lines SSL, word lines WL, a ground select line GSL, and bit lines BL. The peripheral circuit 60 includes a control logic unit 61, a row decoder 62, and a page buffer 63. According to some embodiments, the memory cell array 50 is connected to the row decoder 62 via the string select lines SSL, the word lines WL, and the ground select line GSL, connected to the page buffer 63 via the bit lines BL, and connected to a common source line driver 64 via a common source line CSL.

Figure 2:
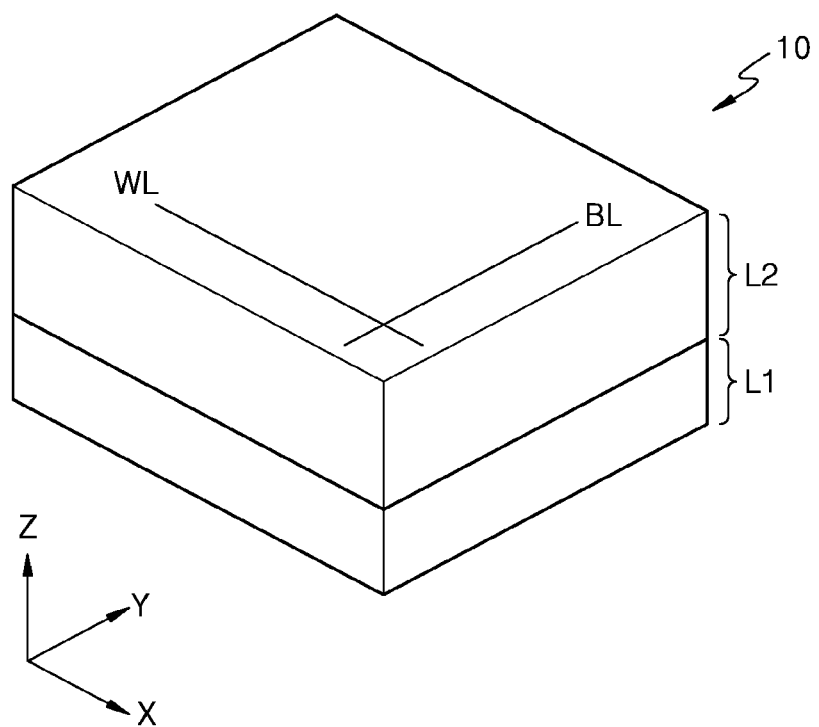
FIG. 2 is a schematic perspective view of a semiconductor memory device according to some embodiments.

FIG. 2 is a conceptual diagram schematically illustrating a structure of the semiconductor memory device 10 of FIG. 1 according to some embodiments.

The semiconductor memory device 10 includes the memory cell array 50 and the peripheral circuit 60, and these components of the semiconductor memory device 10 may be formed via a semiconductor manufacturing process.

Referring to FIGS. 1 and 2, the semiconductor memory device 10 includes a first semiconductor device layer L1 and a second semiconductor device layer L2. According to some embodiments, the second semiconductor device layer L2 is arranged on the first semiconductor device layer L1 in a first direction (Z direction). According to some embodiments, the memory cell array 50 of FIG. 1 may be formed in the second semiconductor device layer L2, and the peripheral circuit 60 may be formed in the first semiconductor device layer L1.

The first semiconductor layer L1 may include a lower substrate. The first semiconductor device layer L1 may include semiconductor devices, such as transistors, and wires for driving the semiconductor devices, formed on the lower substrate. Accordingly, for example, circuits corresponding to the control logic unit 61, the row decoder 62, the page buffer 63, and the common source line driver 64 of FIG. 1 may be formed.

The second semiconductor layer L2 may include a conductive layer and an upper substrate arranged on the conductive layer. According to some embodiments, upper surfaces of the upper substrate and the lower substrate may be substantially perpendicular to the first direction (Z direction), but the inventive concept is not limited thereto. According to some embodiments, the upper substrate may include a plurality of layers. The second semiconductor layer L2 may include the memory cell array 50 formed on the upper substrate. According to some embodiments, at least one conductive layer may serve to supply the common source voltage to the memory cell array 50.

According to some embodiments, conductive patterns for connecting the memory cell array 50 to the peripheral circuit 60 included in the first semiconductor device layer L1 may be formed in the second semiconductor device layer L2. According to some embodiments, a plurality of word lines WL may extend in a second direction (X direction) perpendicular to the first direction (Z direction). According to some embodiments, a plurality of bit lines BL may extend in a third direction (Y direction) perpendicular to the first direction (Z direction). The first direction (Z direction), the second direction (X direction), and the third direction (Y direction) may be substantially perpendicular to one another. A term 'vertical direction' used below may refer to a direction substantially parallel to the first direction (Z direction), and a term 'vertical level' may refer to a height from a reference surface (for example, an upper surface of the upper substrate) in the first direction (Z direction). A term 'horizontal direction' used below may refer to a direction perpendicular to the first direction (Z direction). For example, the horizontal direction may refer to the third direction (Y direction), the second direction (X direction) or any direction between the third direction and the second direction.

The memory cells included in the memory cell array 50 may be accessed by the plurality of word lines WL and the plurality of bit lines BL. The plurality of word lines WL and the plurality of bit lines BL may be electrically connected to the peripheral circuit 60 formed in the first semiconductor device layer L1.

Accordingly, the semiconductor memory device 10 may have a structure in which the memory cell array 50 and the peripheral circuit 60 are arranged in the first direction (Z direction), namely, a Cell-On-Peripheral Circuit or Cell-Over-Peripheral Circuit (COP) structure. According to some embodiments, a circuit other than the memory cell array 50 may be arranged below the memory cell array 50, and thus the COP structure may reduce a horizontal area of the semiconductor memory device 10. Accordingly, the degree of integration of the semiconductor memory device 10 may be increased.

Although the semiconductor memory device 10 has a COP structure in FIG. 2, this is merely an example, and the inventive concept is not limited thereto. For example, the technical spirit of the inventive concept is substantially equally applicable to memory devices having a structure in which a peripheral circuit region is arranged horizontally apart from a cell region on the same level as the cell region.

Figure 3:
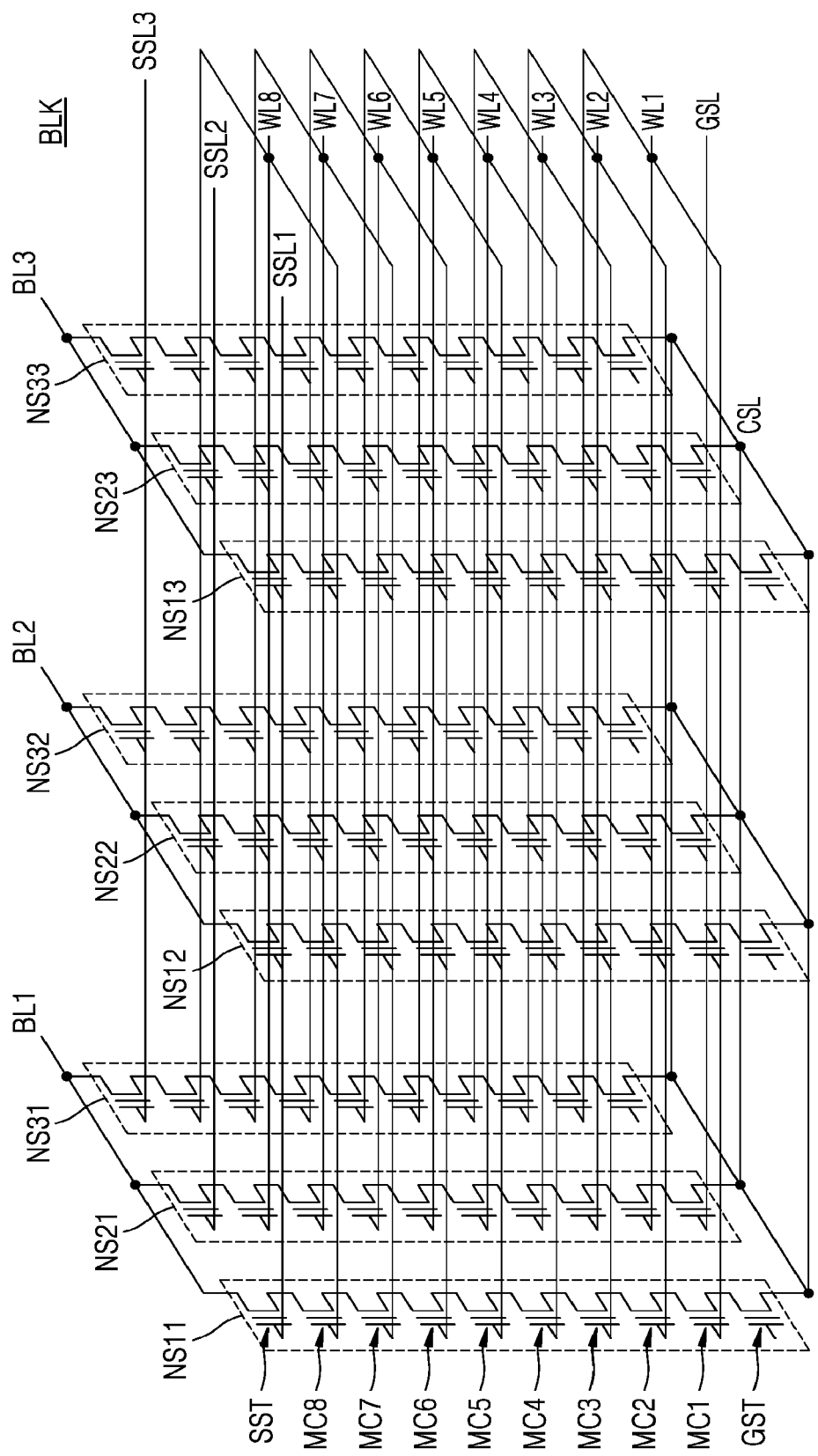
FIG. 3 is a circuit diagram for explaining an operation of a semiconductor memory device, according to some embodiments.

FIG. 3 is a schematic circuit diagram for explaining a circuit structure of the memory blocks BLK1 through BLKz of FIG. 1 according to some embodiments. A memory block BLK of FIG. 3 may be one of the memory blocks BLK1 through BLKz of FIG. 1.

Referring to FIG. 3, the memory block BLK may be a NAND flash memory having a vertical structure. The memory block BLK includes a plurality of NAND strings NS11 through NS33 (that is, NAND strings NS11, NS12, NS13, NS21, NS22, NS23, NS31, NS32 and NS33), a ground select line GSL, a plurality of string select lines SSL1, SSL2, and SSL3 (that is, first, second, and third string select lines SSL1, SSL2, and SSL3), a plurality of word lines WL1 through WL8 (that is, first, second, third, fourth, fifth, sixth, seventh, and eighth word lines WL1, WL2, WL3, WL4, WL5, WL6, WL7, and WL8), a plurality of bit lines BL1 through BL3 (that is, first, second, and third bit lines BL1, B2, and BL3), and a common source line CSL. The number of NAND strings, the number of word lines, the number of bit lines, the number of ground select lines, and the number of string select lines may vary according to embodiments, and the inventive concept is not limited thereto.

According to some embodiments, the plurality of NAND strings NS11 through NS33 are connected between the plurality of bit lines BL1 through BL3 and the common source line CSL. Each of the NAND strings NS11, NS21, NS31, NS12, NS22, NS32, NS13, NS23, and NS33 includes a string select transistor SST, a plurality of memory cells MC1 through MC8 (that is, memory cells MC1, MC2, MC3, MC4, MC5, MC6, MC7 and MC8), and a ground select transistor GST that are serially connected to each other.

Figure 4A:
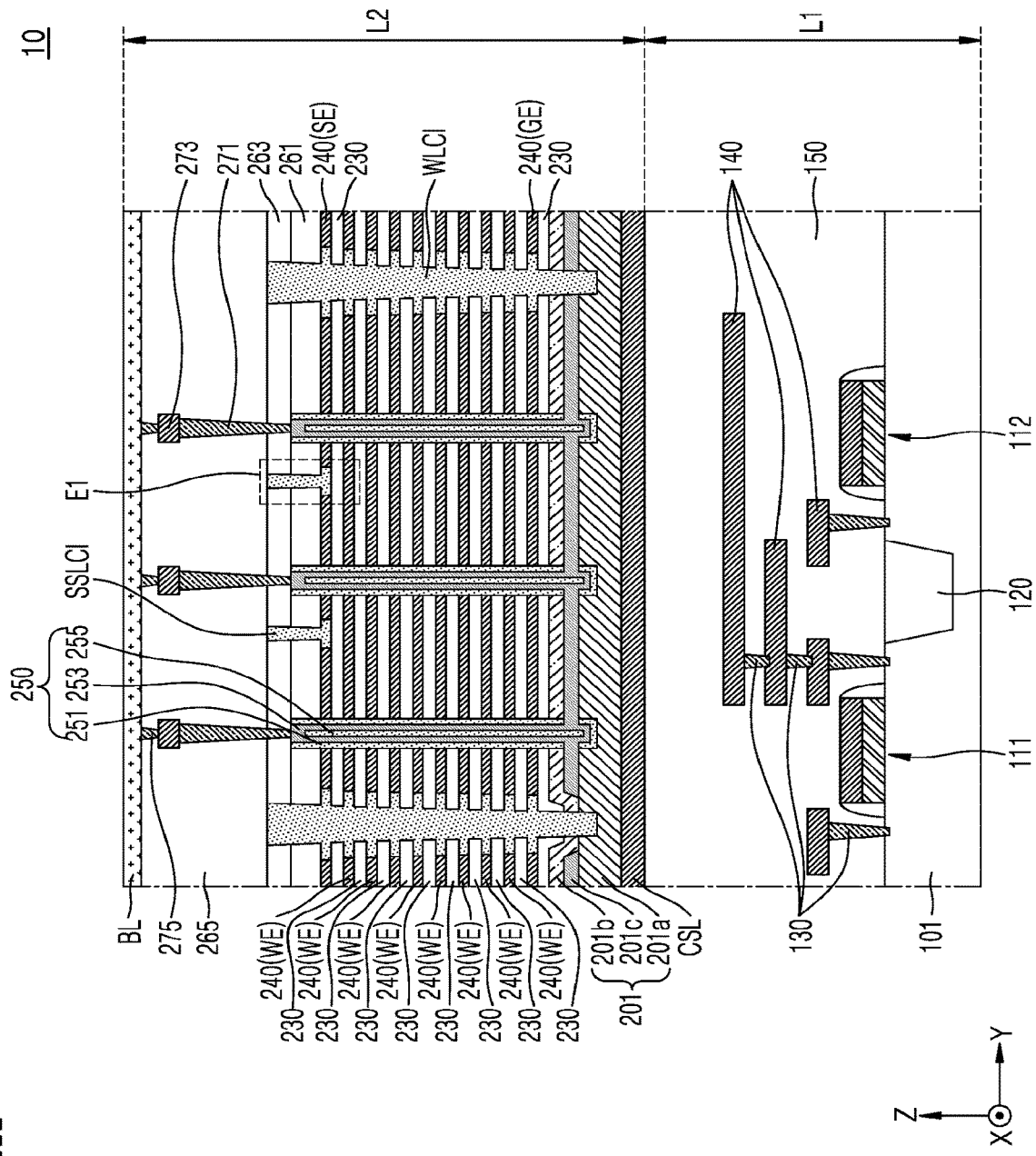
FIG. 4A is a cross-sectional view for explaining a semiconductor memory device according to some embodiments.
Figure 4B:
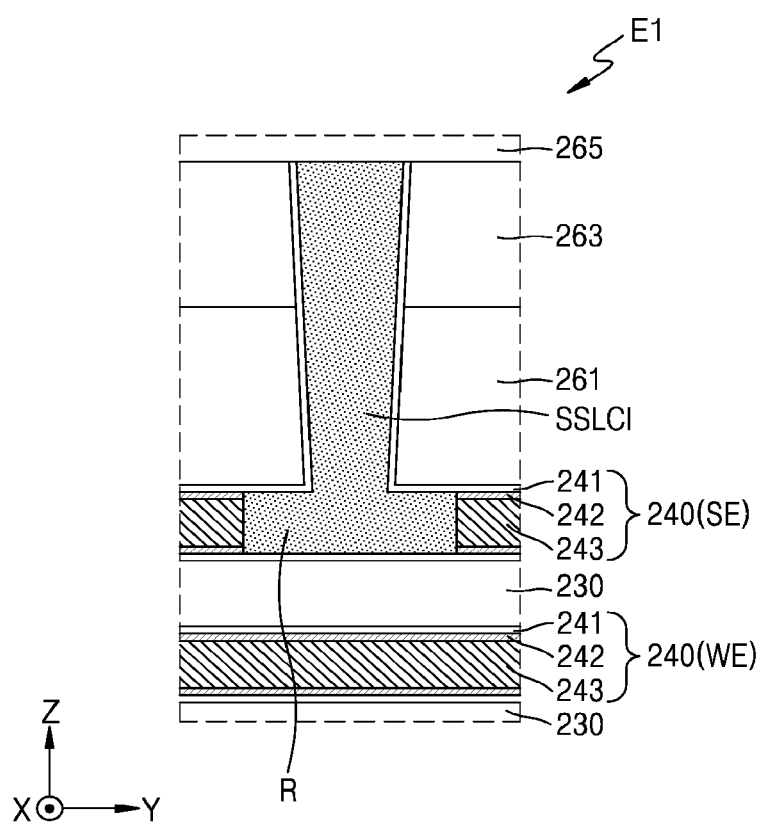
FIG. 4B is an enlarged cross-sectional view of a region of FIG. 4A.

FIG. 4A is a cross-sectional view for explaining the semiconductor memory device 10 according to some embodiments, and FIG. 4B is an enlarged cross-sectional view of a region E1 of FIG. 4A.

Referring to FIG. 4A, the semiconductor memory device 10 includes a first semiconductor device layer L1 including a peripheral circuit, and a second semiconductor device layer L2 including channel structures operating as memory cells. The second semiconductor layer L2 is arranged on the first semiconductor device layer L1.

The first semiconductor device layer L1 includes a lower substrate 101, peripheral transistors 111 and 112, peripheral circuit wires electrically connected to the peripheral transistors 111 and 112, and a lower insulation layer 150 covering the peripheral transistors 111 and 112 and the peripheral circuit wires. The peripheral transistors 111 and 112, the peripheral circuit wires, and the lower insulation layer 150 are arranged on the lower substrate 101. According to some embodiments, the lower insulation layer 150 may include an insulative material. For example, the lower insulation layer 150 may include, but is not limited to, silicon oxide, silicon nitride, silicon oxynitride, or the like.

According to some embodiments, the lower substrate 101 may include a semiconductor substrate including a semiconductor material, such as monocrystalline silicon or monocrystalline germanium. A trench for defining an active area and an inactive area, and an isolation layer 120 filling the trench may be formed on the lower substrate 101.

According to some embodiments, the peripheral transistors 111 and 112 may constitute the peripheral circuit 60 of FIG. 1. According to some embodiments, the peripheral transistors 111 and 112 may constitute the control logic unit 61, the row decoder 62, the page buffer 63, and the common source line driver 64 of FIG. 1.

The peripheral circuit wires include a plurality of peripheral conductive patterns 140 sequentially stacked on the lower substrate 101. The peripheral circuit wires further include a plurality of peripheral vias 130 that connect the peripheral transistors 111 and 112 with the plurality of peripheral conductive patterns 140 formed on different levels. According to some embodiments, the peripheral circuit wires are illustrated as including three layers of peripheral conductive patterns 140 and peripheral vias 130 connecting them to each other, but the inventive concept is not limited thereto. The peripheral circuit wires may include two layers or at least four layers of peripheral conductive lines and vias connecting them to each other.

The second semiconductor device layer L2 includes a common source line CSL, an upper substrate 201 arranged on the common source line CSL, insulation layers 230 and gate electrodes 240 stacked alternately and repeatedly on the upper substrate 201, and first and second upper insulation layers 261 and 263 covering them. The second semiconductor device layer L2 includes channel structures 250 penetrating through the insulation layers 230 and the gate electrodes 240, word line cut insulation layers WLCI separating the gate electrodes 240 from each other, and string selection line cut insulation layers SSLCI separating uppermost gate electrodes 240(SE) from each other. According to some embodiments, the second semiconductor device layer L2 may further include wires enabling the gate electrodes 240 and the channel structures 250 to operate as the memory cell array 50 of FIG. 1.

The common source line CSL is arranged on the first semiconductor device layer L1. According to some embodiments, the common source line CSL may be in a flat plate shape. According to some embodiments, the common source line CSL may include tungsten (W) or a W compound.

According to some embodiments, the upper substrate 201 may be a support layer that supports the insulation layers 230 and the gate electrodes 240. According to some embodiments, the upper substrate 201 may include, but is not limited to, a plurality of layers. For example, the upper substrate 201 may include a single layer. According to some embodiments, the upper substrate 201 includes a first upper substrate layer 201a arranged on the common source line CSL, a second upper substrate layer 201b arranged on the first upper substrate layer 201a, and a third upper substrate layer 201c between the first and second upper substrate layers 201a and 201b. The first upper substrate layer 201a contacts the third upper substrate layer 201c. The third upper substrate layer 201c may contact the second upper substrate layer 201b. The third upper substrate layer 201c may include an opening that exposes an upper surface of the first upper substrate layer 201a. The second upper substrate layer 201b may partially contact the first upper substrate layer 201a via the opening. The term "contact," as used herein, refers to a direct connection (i.e., touching) unless the context indicates otherwise.

According to some embodiments, the first, second, and third upper substrate layers 201a, 201b, and 201c may include polysilicon. According to some embodiments, the first, second, and third upper substrate layers 201a, 201b, and 201c may include doped polysilicon layers. According to some embodiments, the first, second, and third upper substrate layers 201a, 201b, and 201c may be doped at substantially the same concentration, but the inventive concept is not limited thereto.

The first, second, and third upper substrate layers 201a, 201b, and 201c may include bulk silicon substrates, silicon on insulator (SOI) substrates, germanium substrates, germanium on insulator (GOI) substrates, silicon-germanium substrates, or epitaxial thin-film substrates obtained via selective epitaxial growth (SEG). The first, second, and third upper substrate layers 201a, 201b, and 201c may include, for example, at least one of silicon (Si), germanium (Ge), silicon germanium (SiGe), gallium arsenic (GaAs), indium gallium arsenic (InGaAs), aluminum gallium arsenic (AlGaAs), or a mixture thereof.

According to some embodiments, the gate electrodes 240 may correspond to gates of the transistors of FIG. 3. For example, lowermost gate electrodes 240(GE) may correspond to gates of the ground selection transistors GST of FIG. 3, the uppermost gate electrode 240(SE) may correspond to gates of the string selection transistors SST of FIG. 3, and gate electrodes 240(WE) between the lowermost and uppermost gate electrodes 240(GE) and 240(SE) may correspond to gates of the plurality of memory cells MC1 through MC8 of FIG. 3. Referring to FIG. 4A, the eight gate electrodes 240(WE) are illustrated as operating as the gates of the memory cells, but the inventive concept is not limited thereto. For example, various numbers of gate electrodes 240, such as 4, 16, 32, 64, or 128, may operate as the gates of the memory cells.

According to some embodiments, one or more dummy gate electrodes may be further arranged between the gate electrodes 240(GE) corresponding to the ground selection transistors GST of FIG. 3 and the gate electrodes 240(WE) corresponding to the memory cells MC1 of FIG. 3, and/or between the gate electrodes 240(SE) corresponding to the string selection transistors SST of FIG. 3 and the gate electrode 240(WE) corresponding to the memory cells MC8 of FIG. 3. In this case, inter-cell interference generated between adjacent gate electrodes 240 may be reduced.

According to some embodiments, the gate electrodes 240 may include a conductive material. According to some embodiments, as shown in FIG. 4B, each of the gate electrodes 240 may include a plurality of layers. According to some embodiments, the gate electrodes 240 may include tungsten, tantalum, cobalt, nickel, tungsten silicide, tantalum silicide, cobalt silicide, or nickel silicide. According to some embodiments, the gate electrodes 240 may include polysilicon.

According to some embodiments, first and second bit line contact vias 271 and 275, an upper conductive pattern 273, and a bit line BL, which will be described later, may include at least one of the materials mentioned above to explain the gate electrodes 240.

According to some embodiments, the first and second upper insulation layers 261 and 263 are arranged on the uppermost gate electrodes 240(SE). The first and second upper insulation layers 261 and 263 may include an insulative material.

According to some embodiments, the plurality of channel structures 250 penetrate through the first upper insulation layer 261, the gate electrodes 240, and the insulation layers 230 in the first direction (Z direction). The channel structures 250 may penetrate through the second upper substrate layer 201*b*. Lower portions of the channel structures 250 may be covered by the first upper substrate layer 201*a*. Upper surfaces of the channel structures 250 may be coplanar with (i.e., positioned at the same height as) an upper surface of the first upper insulation layer 261, and lower surfaces of the channel structures 250 may be lower than an upper surface of the first upper substrate layer 201*a*. Adjacent channel structures may be arranged apart from each other at certain intervals in the second and third directions (X and Y directions).

According to some embodiments, each of the channel structures 250 may include a plurality of layers. For example, each of the channel structures 250 includes a gate insulation layer 251, a channel layer 253, and a buried insulation layer 255.

According to some embodiments, the gate insulation layer 251 may have a conformal thickness. According to some embodiments, the gate insulation layer 251 may constitute a bottom surface and an external lateral surface of the channel structure 250. Accordingly, according to some embodiments, the gate insulation layer 251 may insulate the channel layer 253 from the gate electrodes 240.

According to some embodiments, the gate insulation layer 251 may include a plurality of layers having a conformal thickness. According to some embodiments, the gate insulation layer 251 may include a tunnel insulation layer, a charge storage layer, and a blocking insulation layer. The tunnel insulation layer may include silicon oxide, hafnium silicide, aluminum oxide, zirconium oxide, tantalum oxide, or the like. The charge storage layer may be a region where electrons tunneled from the channel layer 253 are stored, and may include silicon nitride, boron nitride, silicon boron nitride, or impurity-doped polysilicon. The blocking insulation layer may include a single layer or a stacked layer of silicon oxide, silicon nitride, hafnium silicide, aluminum oxide, zirconium oxide, tantalum oxide, or the like. However, the material of the blocking insulation layer is not limited thereto, and the blocking insulation layer may include a dielectric material having a high dielectric constant value.

According to some embodiments, the gate insulation layer 251 may not be arranged on the same level as the third upper substrate layer 201*c*, because a portion of the gate insulation layer 251 is removed during a replacement process with respect to the third upper substrate layer 201*c*. For example, the third upper substrate layer 201*c* divides the gate insulation layer 251 into an upper gate insulation layer serving as gate insulation layers for the uppermost gate electrodes 240(SE), the gate electrodes 240(WE) and the lowermost gate electrodes 240(GE), and a lower gate insulation layer covering bottom ends of the channel structures 250. Thus, the third upper substrate layer 201*c* and the channel layer 253 are connected to each other.

According to some embodiments, the channel layer 253 may fill a portion of an internal space defined by the gate insulation layer 251. The channel layer 253 formed on an inner sidewall of the gate insulation layer 251 may have a certain thickness. According to some embodiments, an upper portion of the channel layer 253 may have a thickness larger than a portion of the channel layer 253 which is in contact with the inner sidewall of the gate insulation layer 251.

According to some embodiments, a space defined by the channel layer 253 may be filled with the buried insulation layer 255. An upper surface of the buried insulation layer 255 may be covered by the upper portion of the channel layer 253. According to some embodiments, an upper surface of the channel layer 253 may serve as a pad for forming electrical connection with the first bit line contact vias 271. In some cases, a separate contact pad may be provided on the upper surface of the channel layer 253.

Referring to FIG. 4A, the gate insulation layer 251 is illustrated as covering a lower surface of the channel layer 253, but the inventive concept is not limited thereto. In an example embodiment, the gate insulation layer 251 may expose a lower surface of the channel layer 253 and constitute only a sidewall of each of the channel structures 250. In this case, a semiconductor pattern grown from an upper substrate via SEG and the lower surface of the channel layer may contact each other, and the channel layer may not be directly connected to the upper substrate.

According to some embodiments, the word line cut insulation layer WLCI penetrates through the first and second upper insulation layers 261 and 263, the gate electrodes 240, and the insulation layers 230 in the first direction (Z direction). The word line cut insulation layer WLCI further penetrates through the second upper substrate layer 201*b* and a portion of the first upper substrate layer 201*a*. In this case, an end portion of the word line cut insulation layer WLCI is buried in the first upper substrate layer 201*a*. The inventive concept, however, is not limited thereto. According to some embodiments, the word line cut insulation layer WLCI may insulate different gate electrodes 240 arranged on the same vertical level from each other. For example, the gate electrodes 240 separated from other gate electrodes may be disposed between two adjacent word line cut insulation layers (i.e., a pair of word line cut insulation layers).

According to some embodiments, the word line cut insulation layer WLCI may extend long in the second direction (X direction) and thus separate the gate electrodes 240 from each other in the second direction (X direction). A length of the word line cut insulation layer WLCI in the second direction (X direction) may be greater than that of the gate electrodes 240 in the second direction (X direction). Accordingly, the word line cut insulation layer WLCI may completely separate the gate electrodes 240 from each other. Accordingly, the gate electrodes 240 horizontally spaced apart from each other may operate as gates of different transistors (for example, ground selection transistors, memory cell transistors, and/or string selection transistors).

According to some embodiments, the word line cut insulation layer WLCI has a tapered shape in the first direction (Z direction). The tapered shape refers to a shape of which a horizontal width linearly or gradually decreases in a direction toward the upper substrate 201. According to some embodiments, the word line cut insulation layer WLCI includes a portion having a width (for example, a width in the third direction (Y direction)) that decreases in the first direction (Z direction). The word line cut insulation layer WLCI further includes a portion that protrudes on the same level as the gate electrodes 240 in the horizontal direction (for example, the third direction (Y direction)). Accordingly, a portion of the word line cut insulation layer WLCI that is on the same level as a gate electrode 240 has a greater width than a portion of the word line cut insulation layer WLCI that is on the same level as an insulation layer 230 adjacent to the gate electrode 240. The above-described structure of the word line cut insulation layer WLCI may be formed by recessing gate electrode materials during a node separation process P180 of FIG. 9.

According to some embodiments, the word line cut insulation layer WLCI may include an insulative material, such as silicon oxide, silicon nitride, or silicon oxynitride. According to some embodiments, even when the word line cut insulation layer WLCI has the same composition as one of the insulation layers 230 and the first and second upper insulation layers 261 and 263, a first barrier 241 of FIG. 4B is between the word line cut insulation layer WLCI and the insulation layers 230, between the word line cut insulation layer WLCI and the first upper insulation layer 261, and between the word line cut insulation layer WLCI and the second upper insulation layer 263, and thus the word line cut insulation layer WLCI may be distinguished from the insulation layers 230 and the first and second upper insulation layers 261 and 263. The first barrier 241 may be referred to a first barrier layer.

Because a space filled with the word line cut insulation layer WLCI separates gate electrodes connected to adjacent word lines, the space will be referred to as a word line cut. The word line cut is substantially the same as a second word line cut trench WCT2 of FIG. 18A.

Structural and compositional features of the string selection line cut insulation layer SSLCI will be described in detail with reference to FIGS. 4A and 4B. The string selection line cut insulation layer SSLCI may extend in the first direction (Z direction). According to some embodiments, the string selection line cut insulation layer SSLCI is positioned on the same level as the first and second upper insulation layers 261 and 263 and the uppermost gate electrodes 240(SE). According to some embodiments, the string selection line cut insulation layer SSLCI penetrates through the uppermost gate electrodes 240(SE) operating as gate electrodes of the string selection transistors SST of FIG. 3, in the first direction (Z direction). According to some embodiments, the string selection line cut insulation layer SSLCI may insulate horizontally-spaced uppermost gate electrodes 240(SE) from each other.

According to some embodiments, the string selection line cut insulation layer SSLCI may extend long in the second direction (X direction) and thus separate the uppermost gate electrodes 240(SE) from each other in the third direction (Y direction). A length of the string selection line cut insulation layer SSLCI in the second direction (X direction) may be greater than that of the uppermost gate electrodes 240(SE) in the second direction (X direction). According to some embodiments, the string selection line cut insulation layer SSLCI may completely separate the uppermost gate electrodes 240(SE) from each other. Accordingly, uppermost gate electrodes 240(SE) disposed between two adjacent word line cut insulation layers WLCI and horizontally spaced apart from each other may operate as gates of different string selection transistors. For example, as shown in FIG. 3, each block includes three string selection lines SSL1, SSL2 and SSL3 that may be independently controlled, and in FIG. 4A, the uppermost gate electrode 240(SE) is separated by two string selection line cut insulation layers to form three separated uppermost gate electrodes serving as the three string selection lines SSL1, SSL2 and SSL3.

According to some embodiments, a portion of the string selection line cut insulation layer SSLCI that is on the same level as the first and second upper insulation layers 261 and 263 has a tapered shape in the first direction (Z direction). According to some embodiments, the string selection line cut insulation layer SSLCI has a discontinuously-changed width at an interface between the first upper insulation layer 261 and the uppermost gate electrodes 240(SE). According to some embodiments, a width of the string selection line cut insulation layer SSLCI includes a protrusion R protruding from a center of the string selection line cut insulation layer SSLCI in a horizontal direction (for example, the third direction (Y direction)), on the same level as the uppermost gate electrodes 240(SE). According to some embodiments, the string selection line cut insulation layer SSLCI has a maximum width on the same level as the uppermost gate electrodes 240(SE), but the inventive concept is not limited thereto. In an example embodiment, a horizontal width (for example, a width in the third direction (Y direction)) of the string selection line cut insulation layer SSLCI may be maximum at an upper surface of the second upper insulation layer 263.

Each of the uppermost gate electrodes 240(SE) includes the first barrier 241, a second barrier 242, and a gate conductive layer 243. The second barrier 242 may be referred to as a second barrier layer. According to some embodiments, the first barrier 241, the second barrier 242, and the gate conductive layer 243 may include different materials from one another. According to some embodiments, the first barrier 241 and the second barrier 242 may have uniform thicknesses. According to some embodiments, the first barrier 241 may have, but is not limited to, a thickness of about 2 nm. According to some embodiments, the second barrier 242 may have, but is not limited to, a thickness of about 2 nm. According to some embodiments, the first barrier 241 may include, but is not limited to, one of metal oxide (for example, aluminum oxide), metal nitride, and metal oxynitride. According to some embodiments, the second barrier 242 may include, but is not limited to, titanium nitride. According to some embodiments, the gate conductive layer 243 may include, but is not limited to, tungsten.

According to some embodiments, a lateral surface of the protrusion R contacts the second barrier 242 and the gate conductive layer 243. According to some embodiments, the protrusion R has a thickness in the first direction (Z direction) that is substantially the same as a sum of respective thicknesses of the second barrier 242 and the gate conductive layer 243 in the first direction (Z direction), but the inventive concept is not limited thereto. Accordingly, a thickness of the uppermost gate electrode 240(SE) in the first direction (Z direction) is greater than that of the protrusion R in the first direction (Z direction).

According to some embodiments, the first barrier 241 may be between the string selection line cut insulation layer SSLCI and the second upper insulation layer 263. According to some embodiments, the first barrier 241 is disposed between the string selection line cut insulation layer SSLCI and the first upper insulation layer 261. Accordingly, the string selection line cut insulation layer SSLCI is spaced apart from the first and second upper insulation layers 261 and 263. According to some embodiments, an upper surface of the protrusion R and a lower surface thereof contact the first barrier 241.

According to some embodiments, the first barrier 241 covers the upper and lower surfaces of the protrusion R. According to some embodiments, the first barrier 241 covers the portion of the string selection line cut insulation layer SSLCI that is on the same level as the first and second upper insulation layers 261 and 263. According to some embodiments, the first barrier 241 covers the first and second upper insulation layers 261 and 263 adjacent to the string selection line cut insulation layer SSLCI.

According to some embodiments, the string selection line cut insulation layer SSLCI may include an insulative material, such as silicon oxide, silicon nitride, or silicon oxynitride. According to some embodiments, even when the string selection line cut insulation layer SSLCI has the same composition as one of the first and second upper insulation layers 261 and 263, the first barrier 241 is between the string selection line cut insulation layer SSLCI and the first and second upper insulation layers 261 and 263, and thus the string selection line cut insulation layer SSLCI may be distinguished from the insulation layers 230 and the first and second upper insulation layers 261 and 263 by the first barrier 241. A sidewall of the string selection line cut insulation layer SSLCI is spaced apart from sidewalls of the first and second upper insulation layers 261 and 263 by the first barrier 241. In an example embodiment, the first barrier 241 may contact the sidewall of the string selection line cut insulation layer SSLCI and the sidewalls of the first and second upper insulation layers 261 and 263.

Referring to FIG. 4A, two string selection line cut insulation layers SSLCI are illustrated as being arranged between adjacent word line cut insulation layers WLCI, but the present disclosure is not limited thereto. For example, three or more string selection line cut insulation layers SSLCI may be arranged between adjacent word line cut insulation layers WLCI.

A third upper insulation layer 265 is arranged on the second upper insulation layer 263. The third upper insulation layer 265 may include an insulative material. According to some embodiments, the first and second bit line contact vias 271 and 275 may extend in the first direction (Z direction) on the same level as at least a portion of the third upper insulation layer 265. According to some embodiments, combined structures of the first and second bit line contact vias 271 and 275, and the upper conductive pattern 273 penetrate through third upper insulation layer 265, and the first bit line contact vias 271 further penetrate through the second upper insulation layer 263. According to some embodiments, the first bit line contact vias 271 may contact the channel layers 253. According to some embodiments, the upper conductive pattern 273 is arranged between the first and second bit line contact vias 271 and 275. According to some embodiments, the upper conductive pattern 273 may extend in a horizontal direction (for example, the second direction (X direction) and/or the third direction (Y direction)). According to some embodiments, the upper conductive pattern 273 contacts the first and second bit line contact vias 271 and 275. According to some embodiments, the bit line BL contacts the second bit line contact vias 275.

According to some embodiments, the channel structures 250 are connected to the bit line BL via the first bit line contact vias 271, the upper conductive pattern 273, and the second bit line contact vias 275.

Figure 5A:
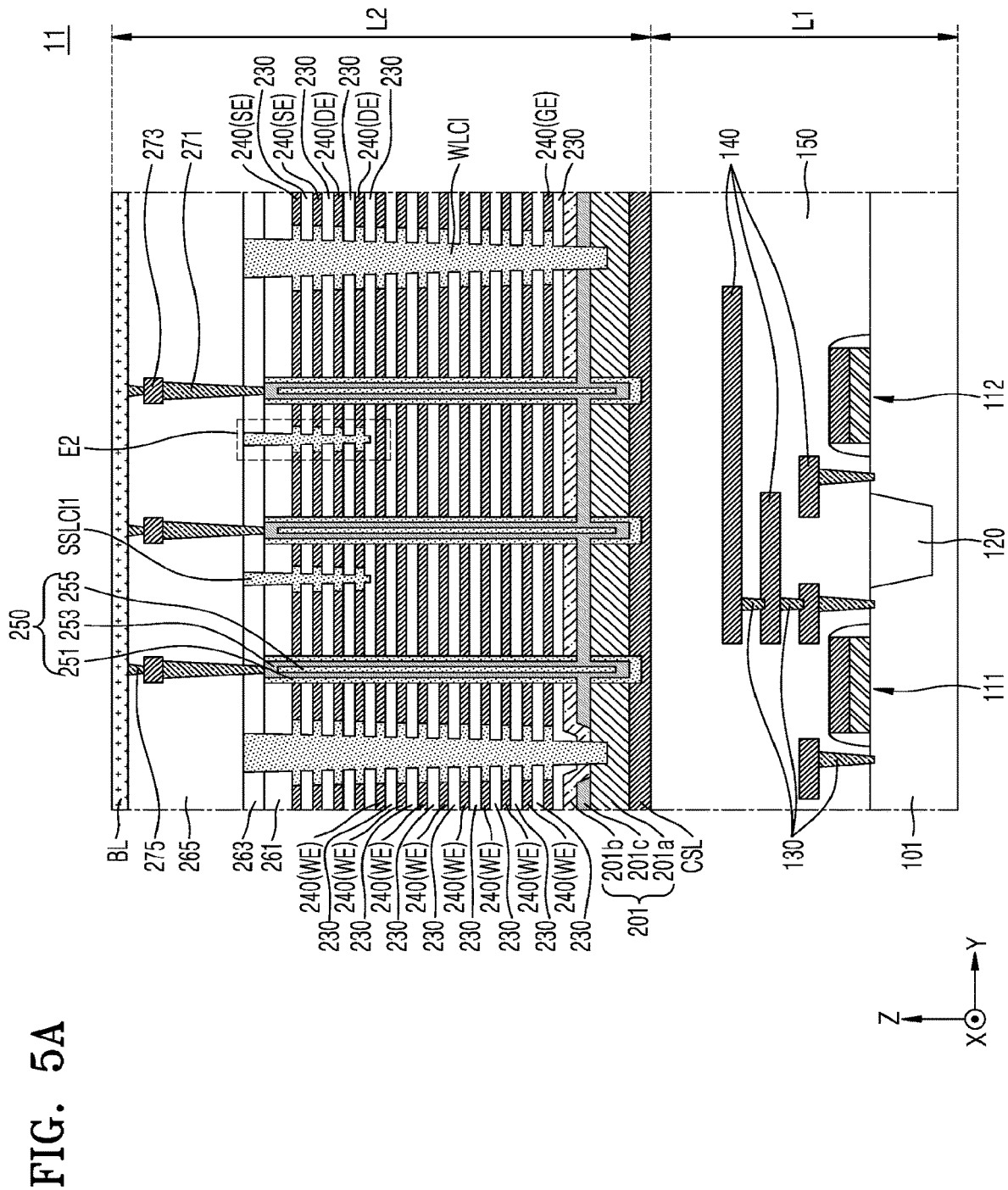
FIG. 5A is a cross-sectional view for explaining a semiconductor memory device according to some embodiments.
Figure 5B:
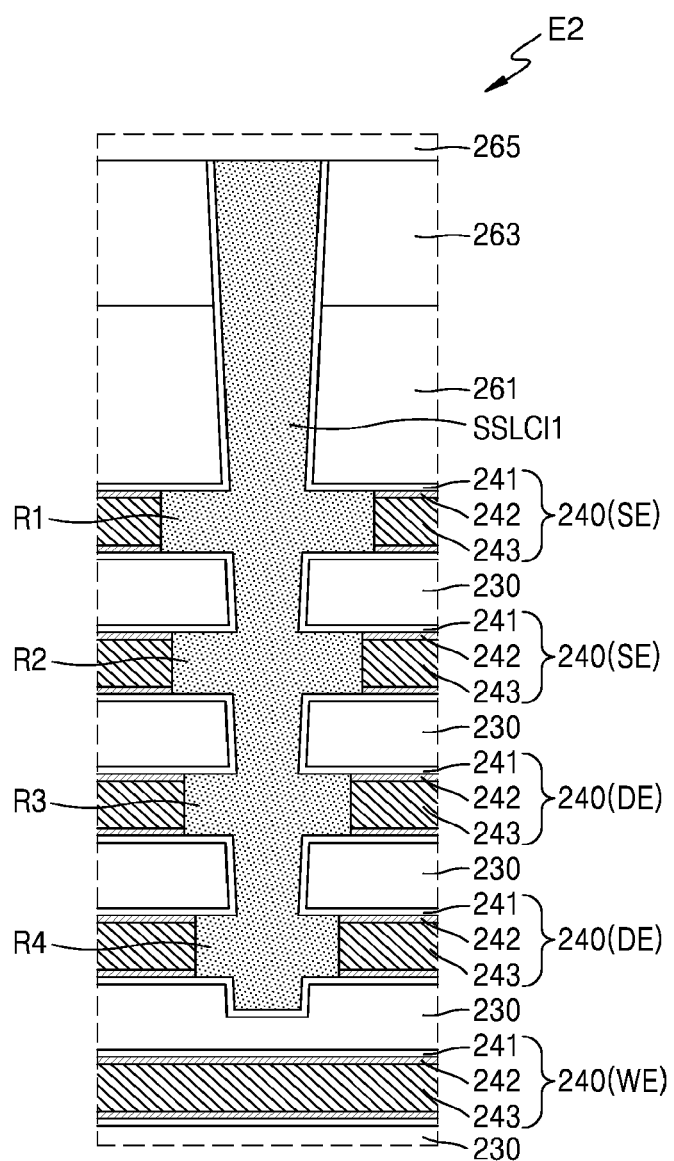
FIG. 5B is an enlarged cross-sectional view of a region of FIG. 5A.

FIG. 5A is a schematic cross-sectional view for explaining a semiconductor memory device 11 according to some other embodiments. FIG. 5B is an enlarged cross-sectional view of a region E2 of FIG. 5A.

For convenience of explanation, a description of FIGS. 5A and 5B that is the same as or similar to that given above with reference to FIGS. 4A and 4B will not be repeated herebelow, and differences between them will now be focused on and described.

Referring to FIG. 5A, the semiconductor memory device 11 includes a plurality of gate electrodes 240. The gate electrodes 240 may correspond to the gates of the transistors of FIG. 3. In detail, lowermost gate electrodes 240(GE) may correspond to the gates of the ground selection transistors GST of FIG. 3. Uppermost gate electrodes 240(SE) and gate electrodes 240(SE) right therebelow may correspond to the gates of the string selection transistors SST of FIG. 3.

Gate electrodes 240(WE) arranged on each of the lowermost gate electrodes 240(GE) may correspond to the gates of the plurality of memory cells MC1 through MC8 of FIG. 3. Referring to FIG. 5A, the eight gate electrodes 240(WE) are illustrated as operating as the gates of the memory cells MC1 through MC8, but the inventive concept is not limited thereto. For example, various numbers of gate electrodes 240, such as 4, 16, 32, 64, and 128, may operate as the gates of memory cells.

A plurality of (for example, two) dummy gate electrodes 240(DE) may be arranged between the gate electrodes 240(WE) corresponding to the eight memory cells MC1 through MC8 of FIG. 3 and the gate electrodes 240(SE) corresponding to the string selection transistors SST of FIG. 3.

However, FIG. 5A illustrates, as a structure of the gate electrodes 240, a case where the plurality of dummy gate electrodes 240(DE) and the gate electrodes 240(SE) corresponding to the string selection transistors SST of FIG. 3 are given, and does not limit the technical spirit of the inventive concept. For example, one or more dummy gate electrodes may be further disposed between the lowermost gate electrodes 240(GE) and the gate electrodes 240(WE), or three or more gate electrodes 240(SE) may correspond to the string selection transistors SST of FIG. 3, or the number of dummy gate electrodes 240(DE) may be one or at least three.

The semiconductor memory device 11 includes a string selection line cut insulation layer SSLCI1. A structure of the string selection line cut insulation layer SSLCI1 will now be described in detail with reference to FIG. 5B.

The string selection line cut insulation layer SSLCI1 may extend in the first direction (Z direction). According to some embodiments, the string selection line cut insulation layer SSLCI1 is positioned on the same level as the first and second upper insulation layers 261 and 263, the gate electrodes 240(SE) corresponding to the string selection transistors SST of FIG. 3, and the dummy gate electrodes 240(DE).

According to some embodiments, the string selection line cut insulation layer SSLCI1 penetrates through the gate electrodes 240(SE) corresponding to the gate electrodes of the string selection transistor SST of FIG. 3, namely, an uppermost gate electrode 240(SE) and a second-uppermost gate electrode 240(SE) right below the uppermost gate electrode 240(SE), in the first direction (Z direction). The string selection line cut insulation layer SSLCI1 further penetrates through the dummy gate electrodes 240(DE) in the first direction (Z direction).

According to some embodiments, the string selection line cut insulation layer SSLCI1 may insulate horizontally-spaced uppermost gate electrodes 240(SE) and horizontally-spaced second-uppermost gate electrodes 240(SE) from each other. According to some embodiments, the string selection line cut insulation layer SSLCI1 may extend long in the second direction (X direction) and thus separate the gate electrodes 240 from each other in the third direction (Y direction). A length of the string selection line cut insulation layer SSLCI1 in the second direction (X direction) may be equal to or greater than that of the gate electrodes 240 in the second direction (X direction). Accordingly, the string selection line cut insulation layer SSLCI1 may completely separate the uppermost gate electrodes 240(SE) from each other. Accordingly, uppermost gate electrodes 240(SE) disposed between two adjacent word line cut insulation layers WLCI and horizontally spaced apart from each other may operate as gates of different string selection transistors. According to some embodiments, the string selection line cut insulation layer SSLCI1 may insulate horizontally-spaced dummy gate electrodes 240(DE) from each other.

According to some embodiments, a portion of the string selection line cut insulation layer SSLCI1 that is on the same level as the first and second upper insulation layers 261 and 263 has a tapered shape in the first direction (Z direction). A portion of the string selection line cut insulation layer SSLCI1 that is on the same level as the insulation layers 230 has a tapered shape in the first direction (Z direction).

According to some embodiments, the string selection line cut insulation layer SSLCI1 has a width (for example, a width in the third direction (Y direction)) discontinuously changing at an interface between the first upper insulation layer 261 and the uppermost gate electrodes 240(SE). According to some embodiments, the string selection line cut insulation layer SSLCI1 includes a first protrusion R1 protruding from a center of the string selection line cut insulation layer SSLCI1 in a horizontal direction (for example, the third direction (Y direction)), on the same level as the uppermost gate electrodes 240(SE). According to some embodiments, the string selection line cut insulation layer SSLCI1 has a maximum width on the same level as the uppermost gate electrodes 240(SE), but the inventive concept is not limited thereto. According to some embodiments, a lateral surface of the first protrusion R1 contacts the second barrier 242 and the gate conductive layer 243. An upper surface and a lower surface of the first protrusion R1 contacts the first barrier 241.

According to some embodiments, the string selection line cut insulation layer SSLCI1 has widths (for example, a width in the third direction (Y direction)) discontinuously changing at interfaces between the insulation layers 230 and some gate electrodes, for example, the second-uppermost gate electrode 240(SE) and the dummy gate electrodes 240(DE). According to some embodiments, the string selection line cut insulation layer SSLCI1 further includes second, third, and fourth protrusions R2, R3, and R4 protruding from the center of the string selection line cut insulation layer SSLCI1 in the horizontal direction (for example, the third direction (Y direction)), on the same level as the second-uppermost gate electrodes 240(SE) and the dummy gate electrodes 240(DE). Lateral surfaces of the second, third, and fourth protrusions R2, R3, and R4 contact the second barriers 242 and the gate conductive layers 243, respectively. Upper surfaces and lower surfaces of the second, third, and fourth protrusions R2, R3, and R4 contact the first barrier 241.

The second protrusion R2 is positioned on the same level as the second-uppermost gate electrode 240(SE). The third protrusion R3 is positioned on the same level as a dummy gate electrode 240(DE) farther from the upper substrate 201 from among the dummy gate electrodes 240(DE). The fourth protrusion R4 is positioned on the same level as a dummy gate electrode 240(DE) closer to the upper substrate 201 from among the dummy gate electrodes 240(DE).

The first protrusion R1 protrudes from the center of the string selection line cut insulation layer SSLCI1 farther than the second protrusion R2. The second protrusion R2 protrudes from the center of the string selection line cut insulation layer SSLCI1 farther than the third protrusion R3. The third protrusion R3 protrudes from the center of the string selection line cut insulation layer SSLCI1 farther than the fourth protrusion R4.

According to some embodiments, the string selection line cut insulation layer SSLCI1 penetrates through the entire portions of the dummy gate electrodes 240(DE). According to some embodiments, the string selection line cut insulation layer SSLCI1 may extend to a lower level than the lower surfaces of the dummy gate electrodes 240(DE). For example, a lower surface of the string selection line cut insulation layer SSLCI1 is located closer to the upper substrate 201 than the lower surfaces of the dummy gate electrodes 240(DE). In this case, the string selection line cut insulation layer SSLCI1 partially penetrates through an upper portion of the insulation layer 230 arranged below the dummy gate electrodes 240(DE). A bottom end of the string selection line cut insulation layer SSLCI1 is buried in the upper portion of the insulation layer 230 arranged below the dummy gate electrodes 240(DE). The string selection line cut insulation layer SSLCI1 has a minimum width on its lower surface of the bottom end.

Figure 6:
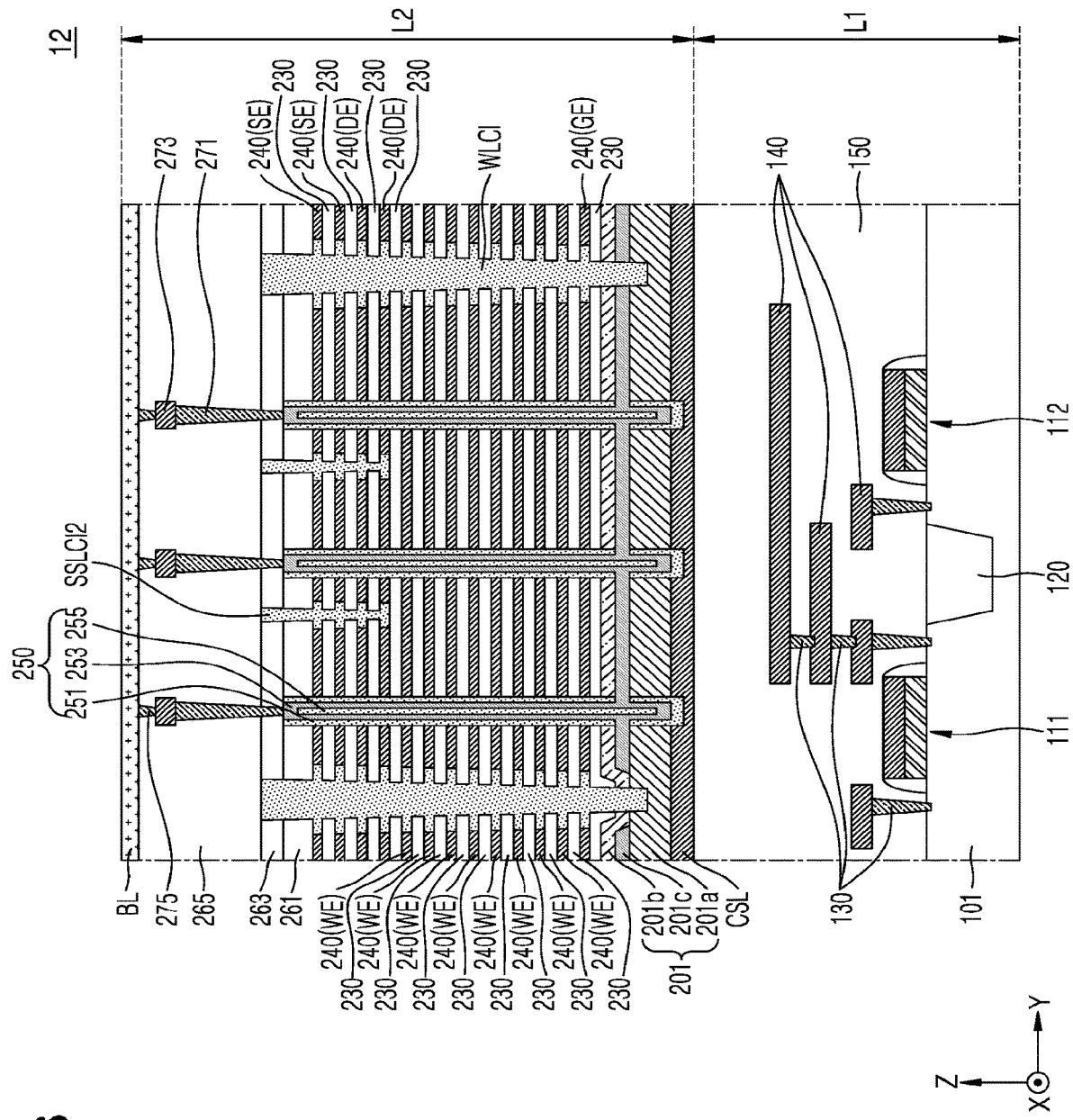
FIGS. 6, 7, and 8 are cross-sectional views for explaining semiconductor memory devices according to some other embodiments.
Figure 7:
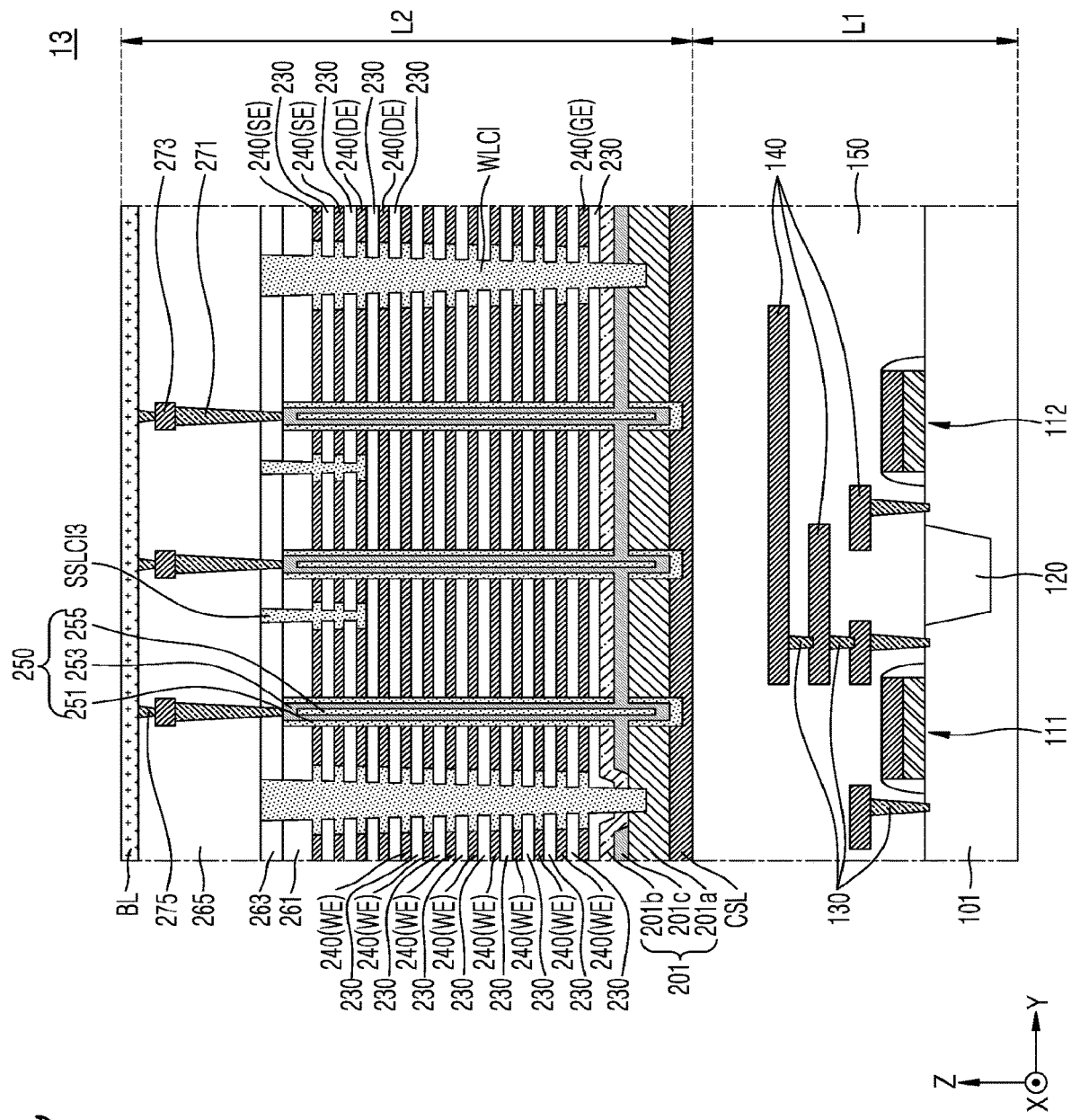
Figure 8:
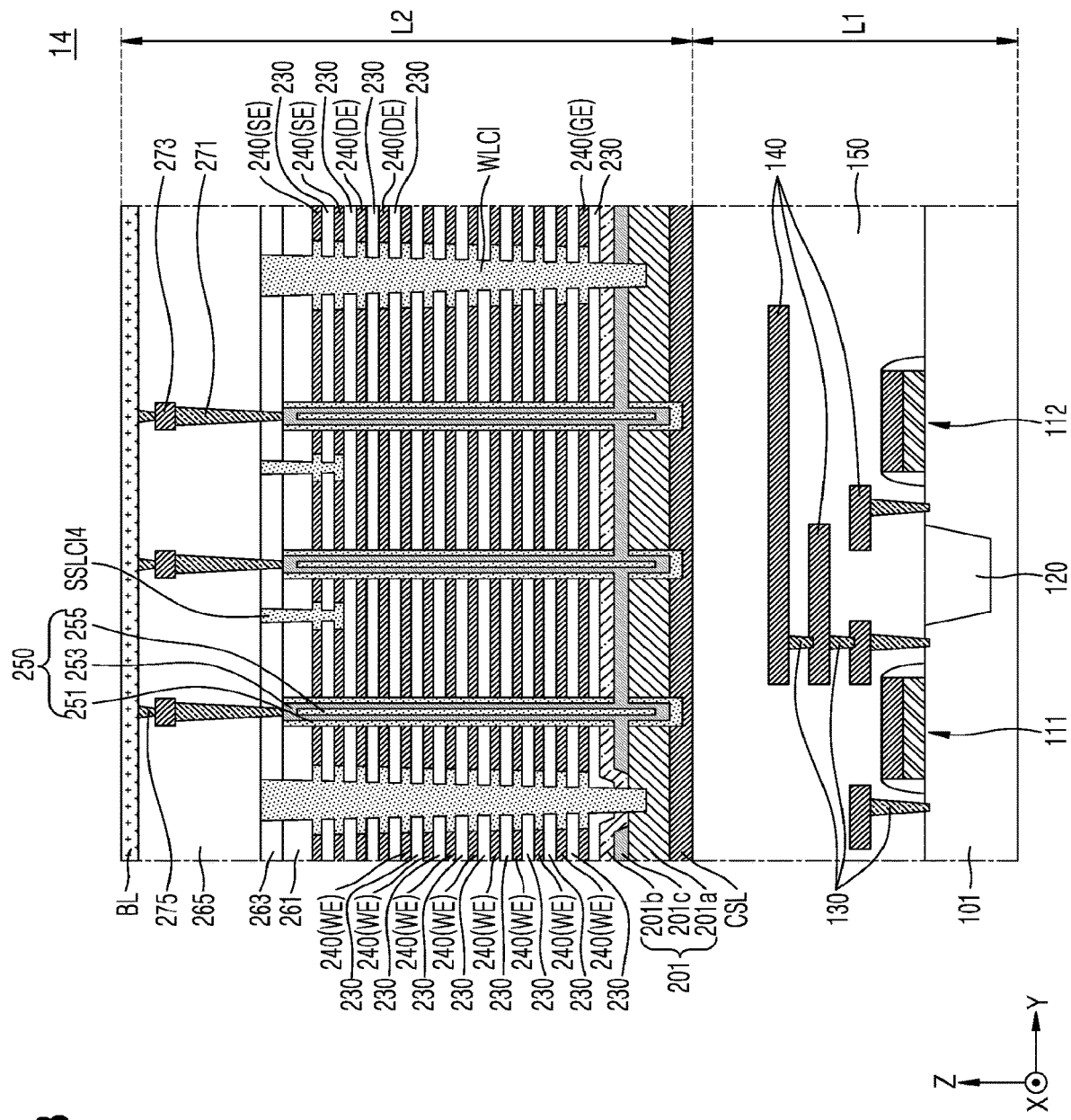

FIGS. 6, 7, and 8 are cross-sectional views for explaining semiconductor memory devices 12, 13, and 14 according to some other embodiments, respectively.

For convenience of explanation, a description of FIGS. 6 through 8 that is the same as or similar to that given above with reference to FIGS. 4A through 5B will not be repeated hereunder, and differences between them will now be focused on and described.

Referring to FIG. 6, a string selection line cut insulation layer SSLCI2 included in the semiconductor memory device 12 may have a different shape from the string selection line cut insulation layer SSLCI1 included in the semiconductor memory device 11 of FIG. 5A.

For example, a lower surface of the string selection line cut insulation layer SSLCI2 is coplanar with (i.e., at the same height as) the lower surface of the dummy gate electrode 240(DE) closer to the upper substrate 201 from among the dummy gate electrodes 240(DE). A horizontal width (for example, a width in the third direction (Y direction)) of an upper surface of the string selection line cut insulation layer SSLCI2 is less than a horizontal width (for example, a width in the third direction (Y direction)) of the lower surface of the string selection line cut insulation layer SSLCI2.

Referring to FIG. 7, a string selection line cut insulation layer SSLCI3 included in the semiconductor memory device 13 may have a different shape from the string selection line cut insulation layer SSLCI1 included in the semiconductor memory device 11 of FIG. 5A.

According to some embodiments, the string selection line cut insulation layer SSLCI3 may penetrate through only some of the dummy gate electrodes 240(DE). For example, the string selection line cut insulation layer SSLCI3 penetrates through only an upper dummy gate of the two dummy gate electrodes 240(DE). In this case, a lower surface of the string selection line cut insulation layer SSLCI3 is coplanar with (i.e. positioned at the same height as) the lower surface of the upper dummy gate electrode farther from the upper substrate 201 from among the dummy gate electrodes 240(DE). According to some embodiments, a horizontal width (for example, a width in the third direction (Y direction)) of an upper surface of the string selection line cut insulation layer SSLCI3 is less than a horizontal width (for example, a width in the third direction (Y direction)) of the lower surface of the string selection line cut insulation layer SSLCI3.

Referring to FIG. 8, a string selection line cut insulation layer SSLCI4 included in the semiconductor memory device 14 may have a different shape from the string selection line cut insulation layer SSLCI1 included in the semiconductor memory device 11 of FIG. 5A.

For example, the string selection line cut insulation layer SSLCI4 may penetrate through only the uppermost and second-uppermost gate electrodes 240(SE) corresponding to the string selection transistors SST of FIG. 3. In this case, the string selection line cut insulation layer SSLCI4 penetrates through only the uppermost and second-uppermost gate electrodes 240(SE). A horizontal width (for example, a width in the third direction (Y direction)) of an upper surface of the string selection line cut insulation layer SSLCI4 is less than a horizontal width (for example, a width in the third direction (Y direction)) of the lower surface of the string selection line cut insulation layer SSLCI4.

Figure 9:
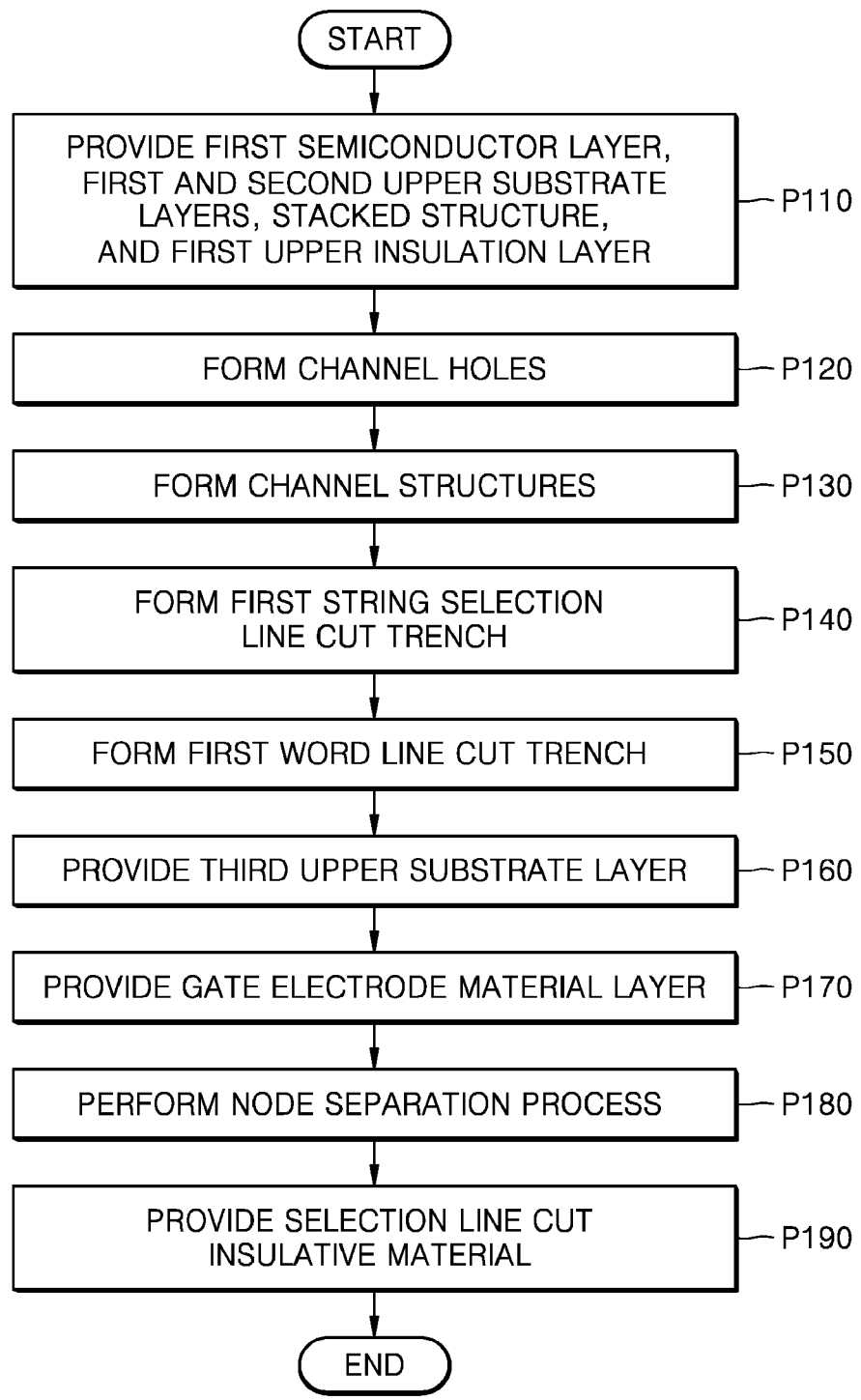
FIG. 9 is a flowchart of a method of manufacturing a semiconductor memory device, according to some embodiments.

FIG. 9 is a flowchart of a method of manufacturing a semiconductor memory device, according to some embodiments.

Figure 11:
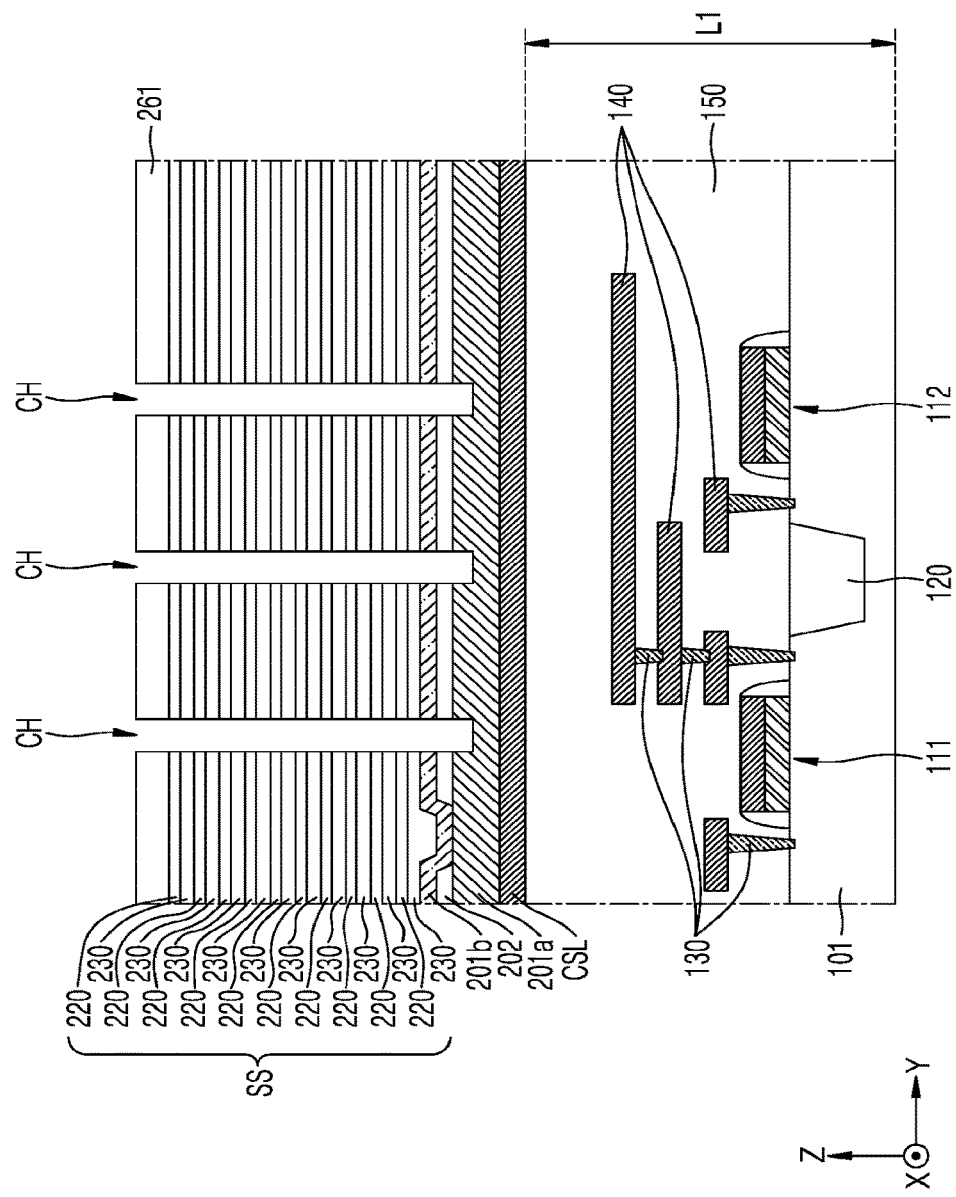
Figure 12:
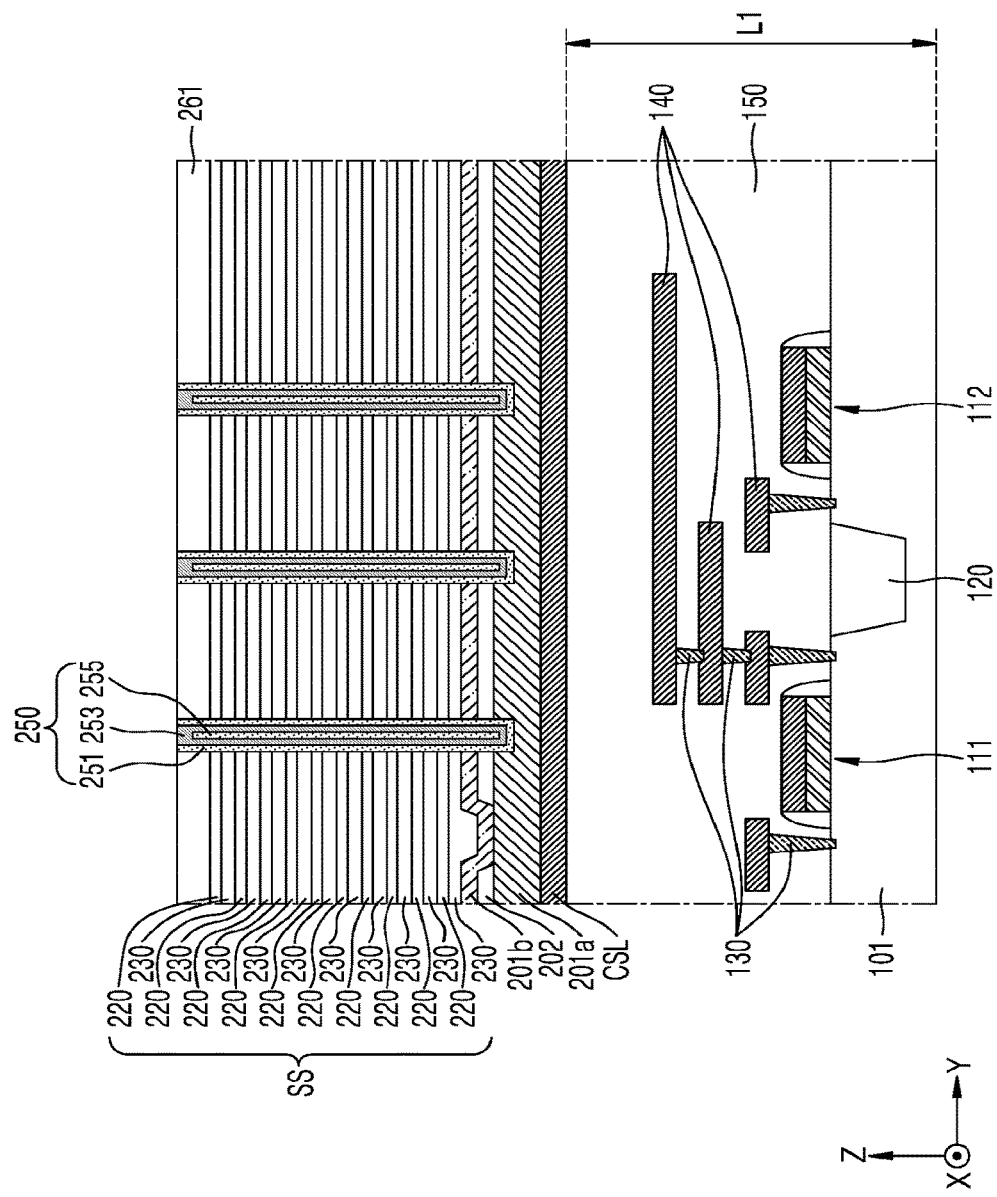
Figure 13A:
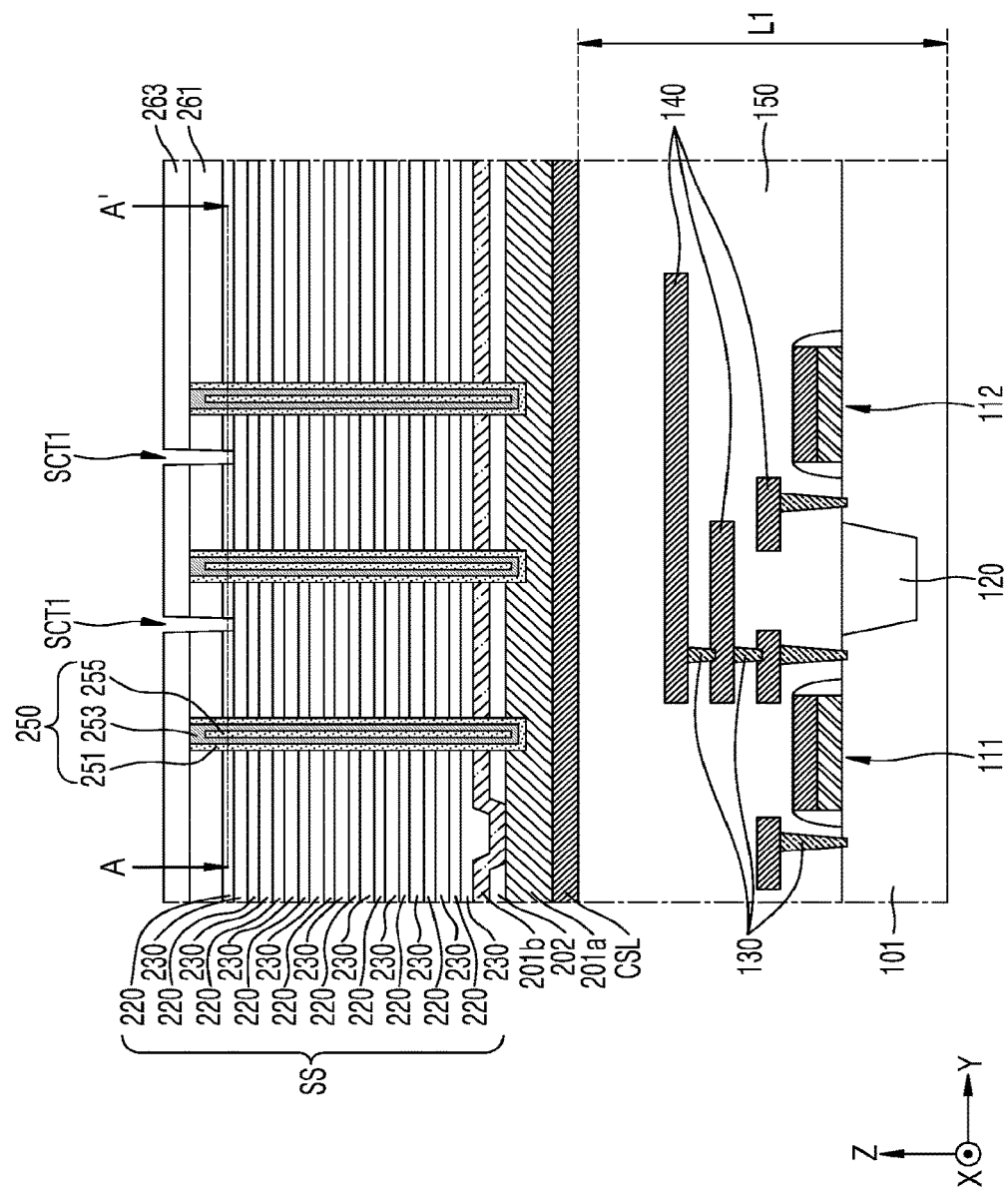
Figure 13B:
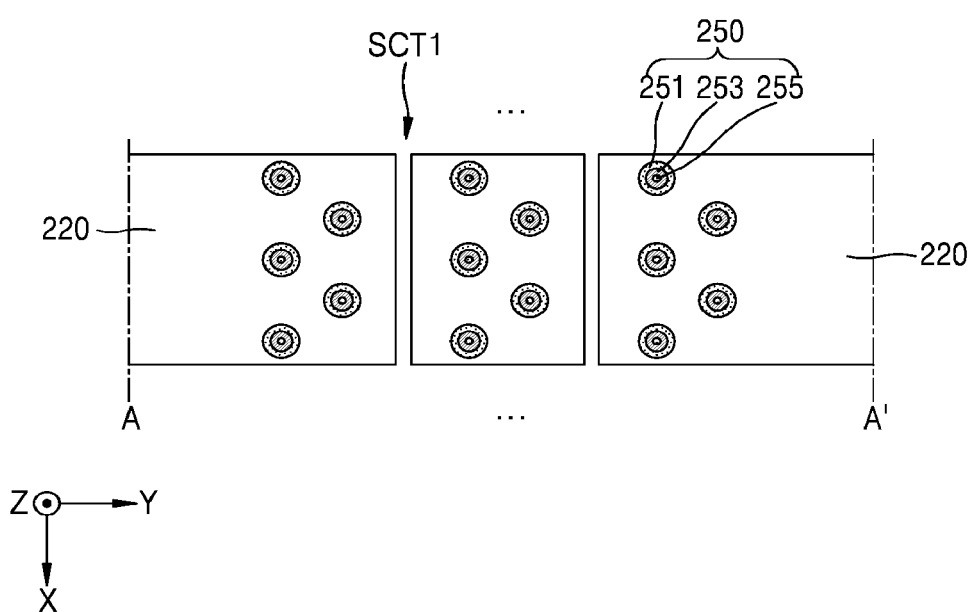
Figure 14A:
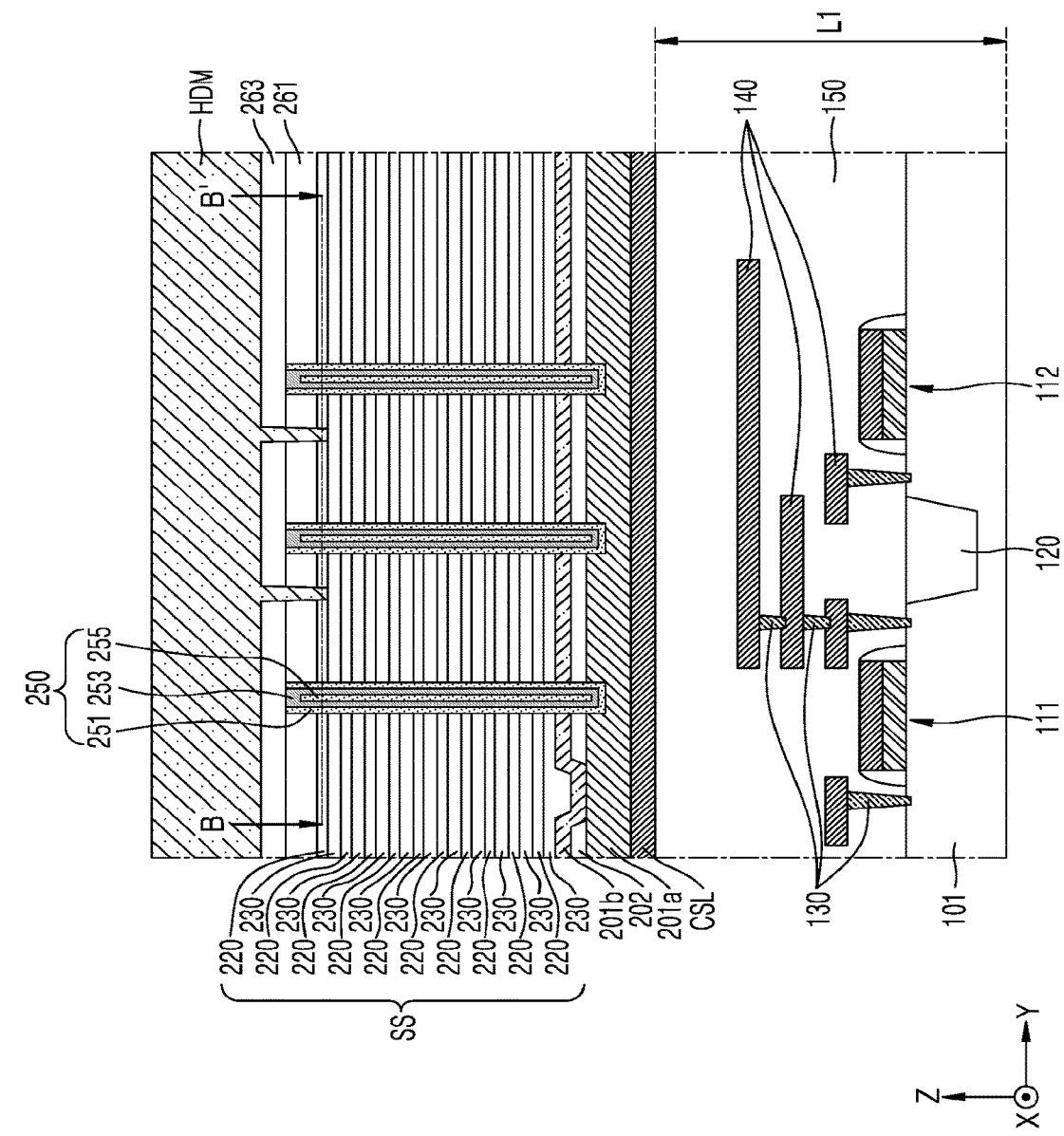
Figure 14B:
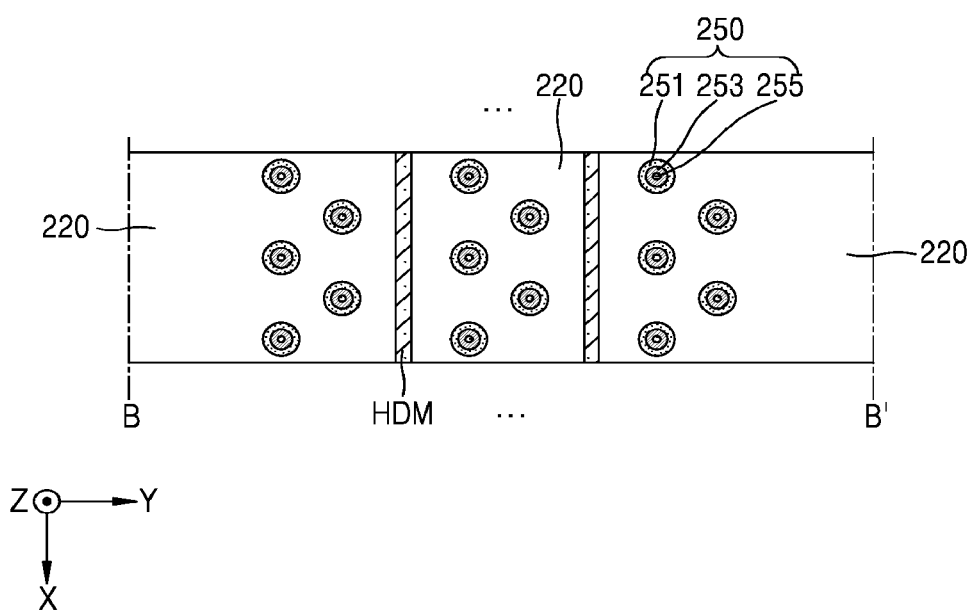
Figure 15A:
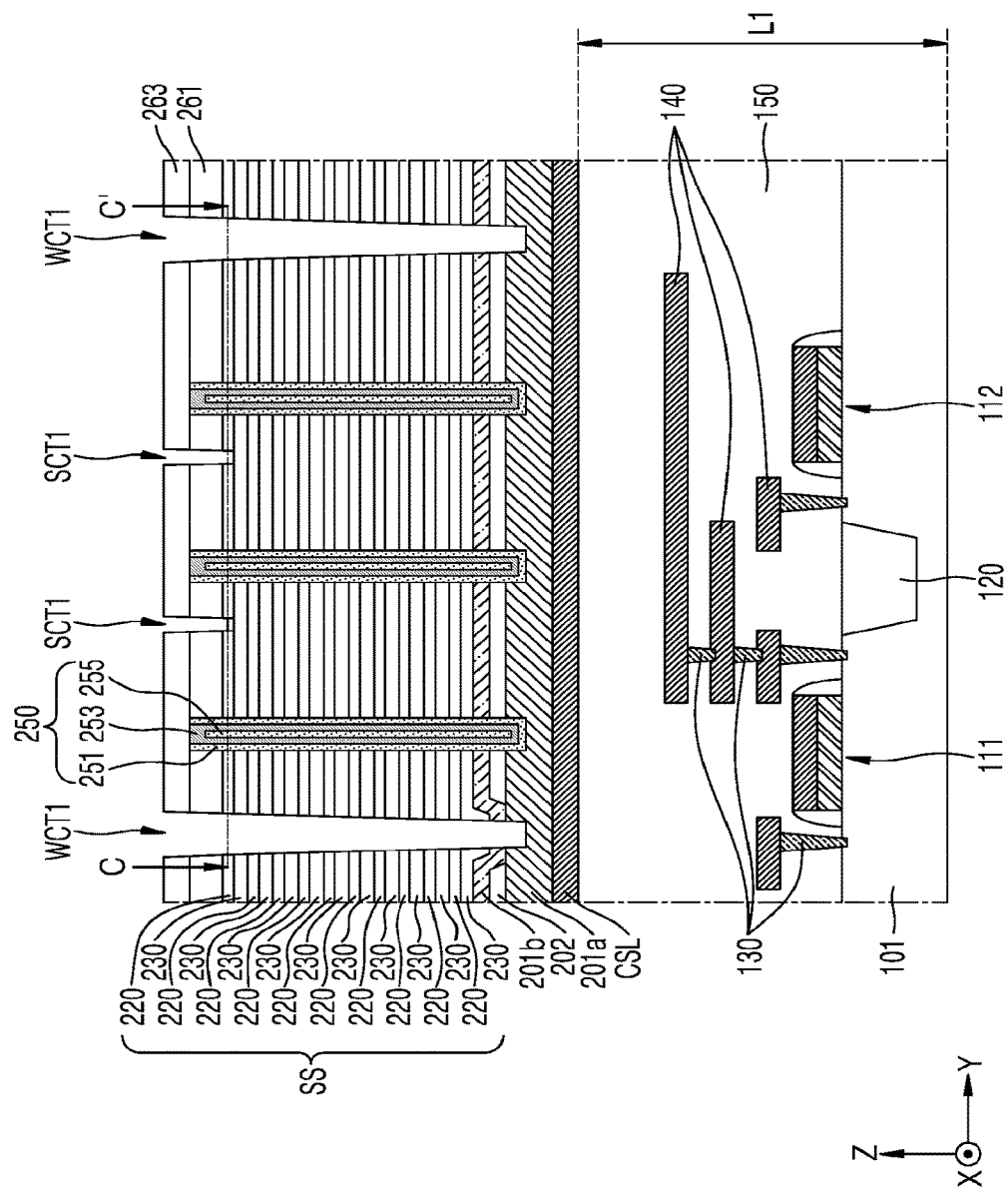
Figure 15B:
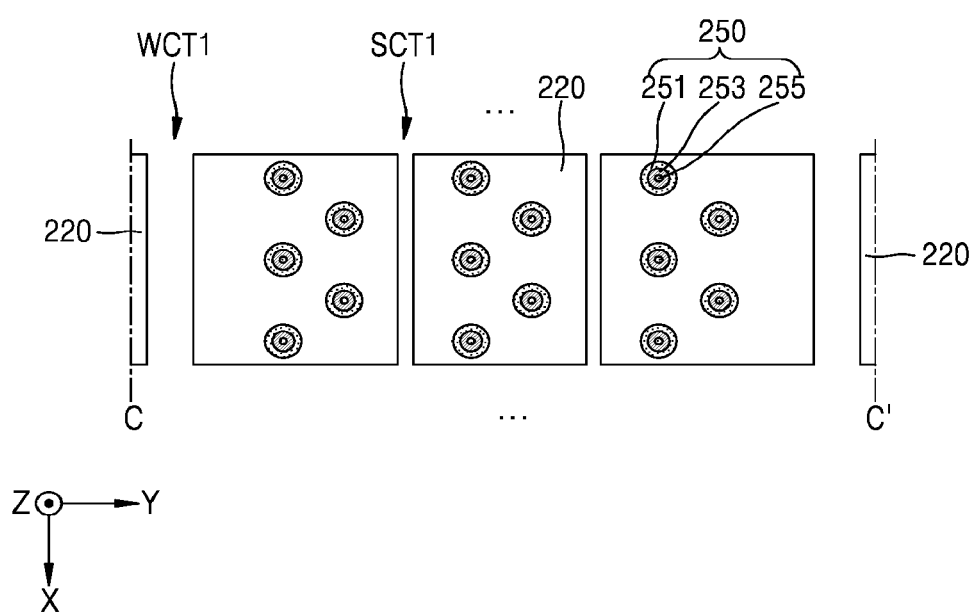
Figure 16:
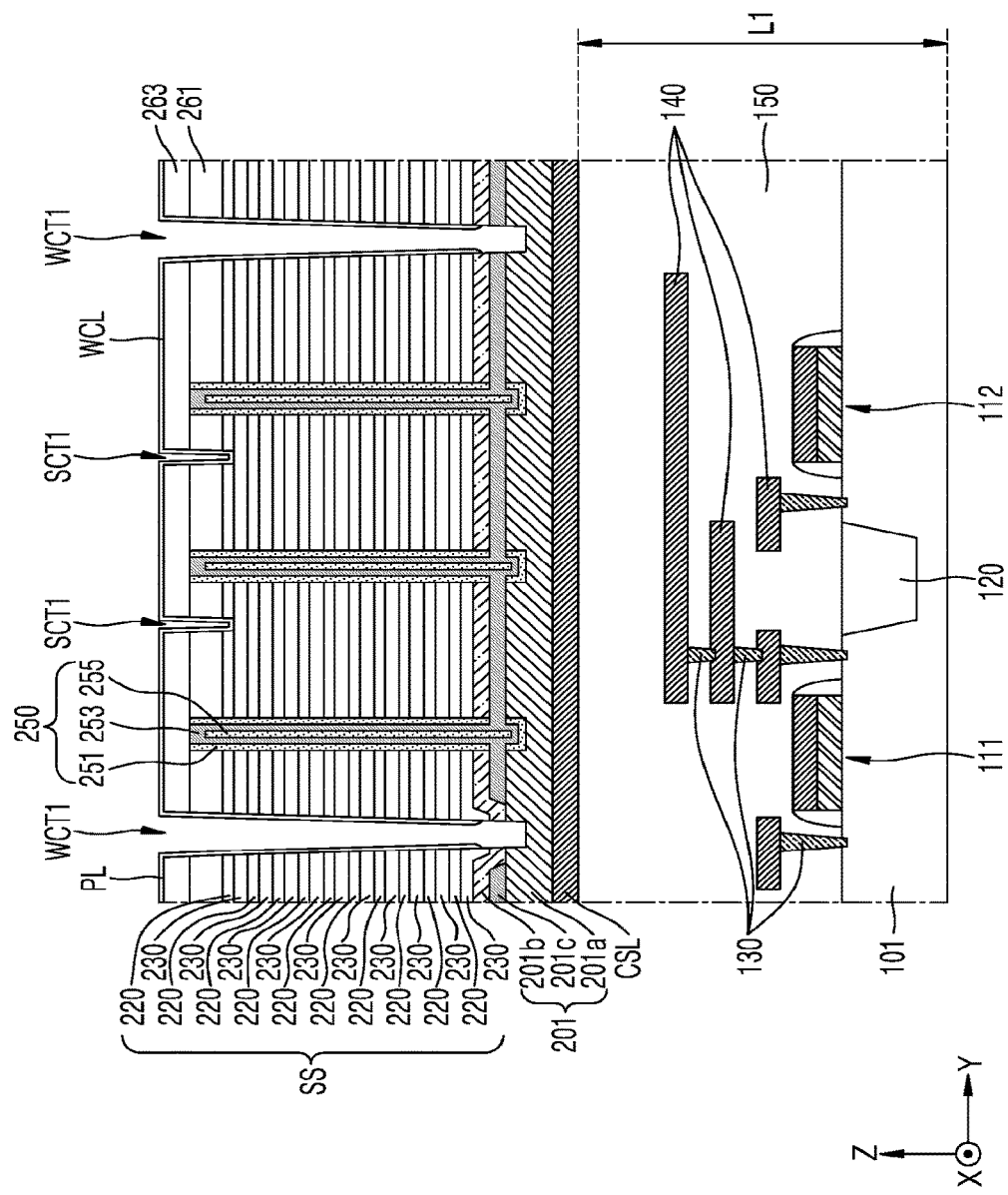
Figure 17A:
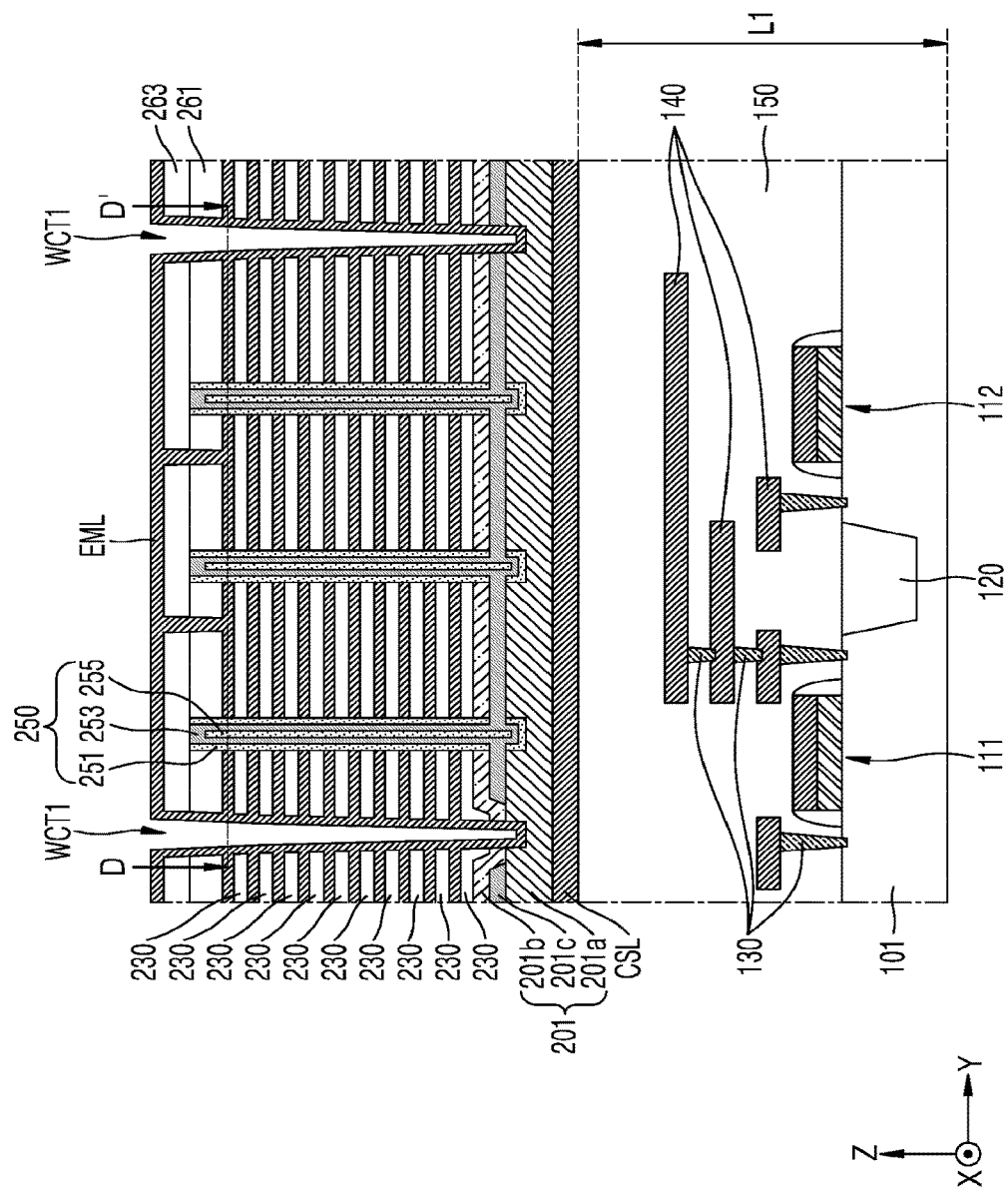
Figure 17B:
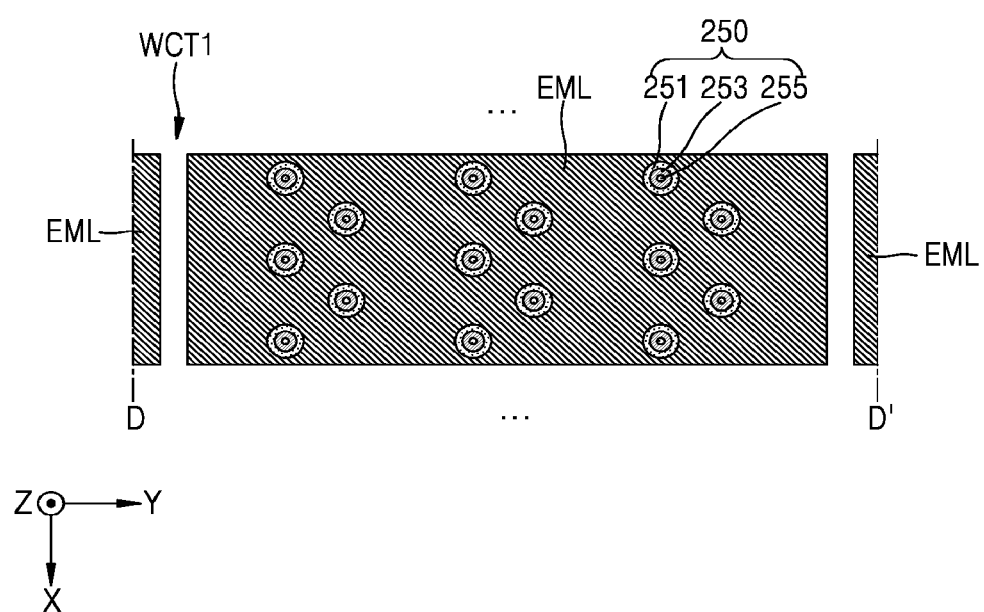

FIGS. 10-13A, 14A, 15A, 16, 17A, 18A, and 19 are cross-sectional views for explaining a method of manufacturing a semiconductor memory device, according to some embodiments. FIG. 13B is a cross-sectional view taken along line A-A' of FIG. 13A, FIG. 14B is a cross-sectional view taken along line B-B' of FIG. 14A, FIG. 15B is a cross-sectional view taken along line C-C' of FIG. 15A, FIG. 17B is a cross-sectional view taken along line D-D' of FIG. 17A, and FIG. 18B is a cross-sectional view taken along line E-E' of FIG. 18A.

The method of manufacturing a semiconductor memory device, which will be described below, is an example of a method of manufacturing the semiconductor memory device 10 of FIGS. 4A and 4B, and does not limit the technical spirit of the inventive concept. One of ordinary skill in the semiconductor technology field may manufacture the semiconductor memory devices 11, 12, 13, and 14 of FIGS. 5A through 8 using substantially the same method as the method which will be described below with reference to FIGS. 9 through 19.

Figure 10:
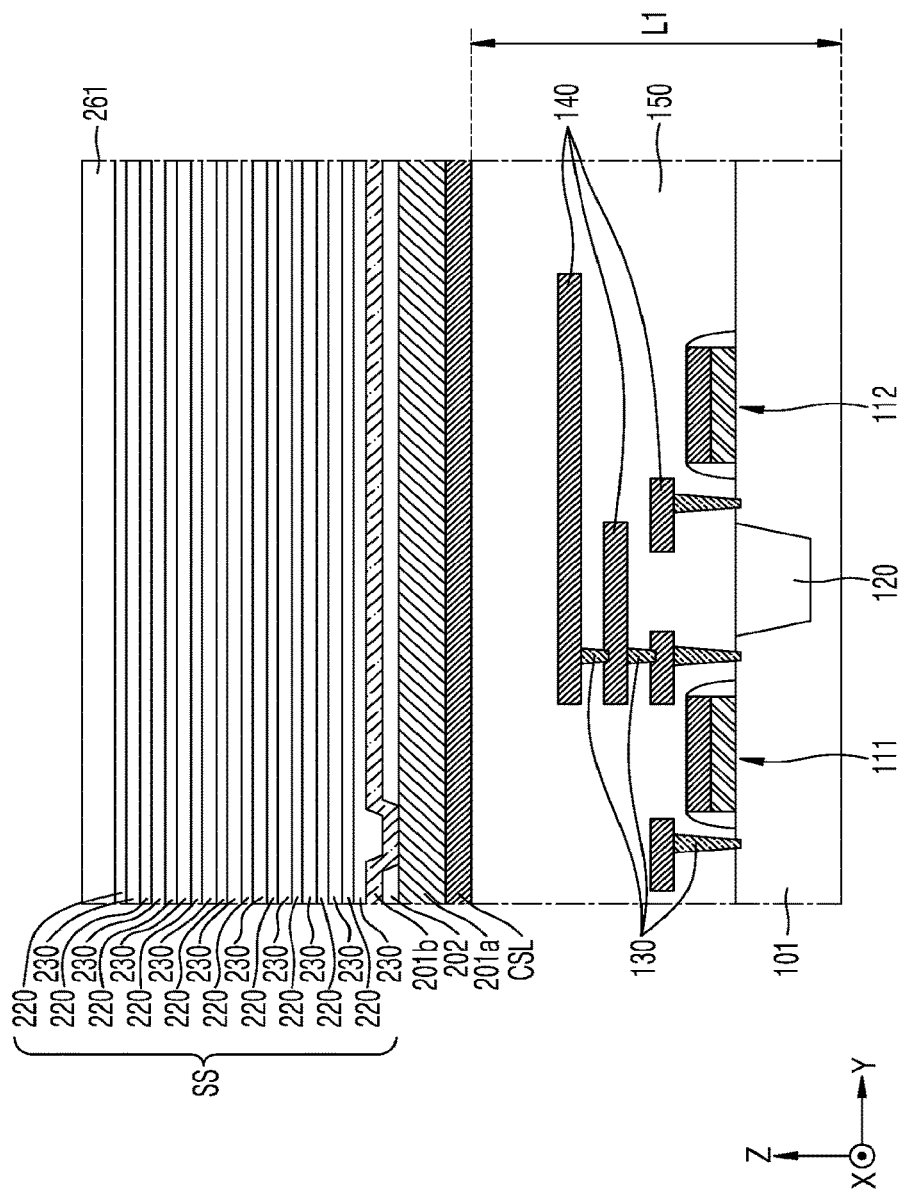
FIGS. 10 through 12, 13A, 13B, 14A, 15A, 16, 17A, 18A and 19 are cross-sectional views

Referring to FIGS. 9 and 10, in P110, the first semiconductor layer L1, the first and second upper substrate layers 201a and 201b, a stacked structure SS, and the first upper insulation layer 261 may be formed.

The provision of the first semiconductor device layer L1 may include a process of forming the isolation layer 120 on the lower substrate 101, a process of forming a p-well region and an n-well region in this stated order (or in a reverse order) in the lower substrate 101 via a first ion injection process using a photoresist pattern for the lower substrate 101, a process of forming the peripheral transistors 111 and 112, and a process of patterning a conductive material and providing an insulative material to thereby form the peripheral circuit wires.

The common source line CSL and the first upper substrate layer 201a may be formed on the lower insulation layer 150. The common source line CSL and the first upper substrate layer 201a may be formed via chemical vapor deposition (CVD), atomic layer deposition (ALD), physical vapor deposition (PVD), or the like.

After an upper substrate sacrificial layer 202 is provided on the first upper substrate layer 201a and a portion of the upper substrate sacrificial layer 202 is patterned and removed, the second upper substrate layer 201b may be conformally formed on the partially-removed upper substrate sacrificial layer 202. The second upper substrate layer 201b may include doped polysilicon. Accordingly, the first upper substrate layer 201a and the second upper substrate layer 201b contact each other through the removed portion of the upper substrate sacrificial layer 202. According to some embodiments, the first and second upper substrate layers 201a and 201b may include doped polysilicon.

According to some embodiments, the upper substrate sacrificial layer 202 may include an insulative material. According to some embodiments, the upper substrate sacrificial layer 202 may include one of silicon oxide, silicon nitride, and silicon oxynitride. According to some embodiments, the upper substrate sacrificial layer 202 may have high etch selectivity with respect to the insulation layers 230.

Then, sacrificial layers 220 and the insulation layers 230 are alternately stacked on the second upper substrate layer 201b to thereby form the stacked structure SS. According to some embodiments, the insulation layers 230 and the sacrificial layers 220 may include different materials from each other. According to some embodiments, the insulation layers 230 may have high etch selectivity with respect to the sacrificial layers 220. For example, when the sacrificial layers 220 include silicon oxide, the insulation layers 230 may include silicon nitride. As another example, when the sacrificial layers 220 include silicon nitride, the insulation layers 230 may include silicon oxide. As another example, when the sacrificial layers 220 include undoped polysilicon, the insulation layers 230 may include silicon nitride or silicon oxide.

The first upper insulation layer 261 may be formed on the stacked structure SS. The first upper insulation layer 261 may include an insulative material.

Referring to FIGS. 9 and 11, in P120, channel holes CH may be formed. After a photoresist material layer is provided on the stacked structure SS, the channel holes CH may be formed via sequential executions of exposure, development, and etching to penetrate through the first upper insulation layer 261, the stacked structure SS, the second upper substrate layer 201b, the upper substrate sacrificial layer 202, and an upper portion of the first upper substrate layer 201a.

Referring to FIGS. 9 and 12, in P130, the channel structures 250 may be formed. After a gate insulative material layer, a channel material layer, and a buried insulative material layer are sequentially provided on the stacked structure SS having the channel holes CH of FIG. 11 formed therein, material layers that fill the channel holes CH may be separated from each other by performing a planarization process until an upper surface of the first upper insulation layer 261 is exposed. In an example embodiment, the planarization process my include an etchback process or a chemically-mechanical polish (CMP) process. Then, an upper portion of the buried insulative material layer within the channel holes CH is further removed to form recessed regions, and then the same material as the channel material layer may be deposited in the recessed regions to cover a recessed upper portion of the buried insulation layer 255. In an example embodiment, the channel material formed in the recessed regions may serve as pads to be contacted by the first bit line contact vias 271 of FIG. 4A.

Referring to FIGS. 9, 13A, and 13B, in P140, a first string selection line cut trench SCT1 may be formed. The formation of the first string selection line cut trench SCT1 may include forming the second upper insulation layer 263 on the first upper insulation layer 261 and then etching the first and second upper insulation layers 261 and 263 and an uppermost sacrificial layer 220 via dry or wet etching. The first string selection line cut trench SCT1 exposes an upper surface of an uppermost insulation layer 230 by penetrating through the first and second upper insulation layers 261 and 263 and an uppermost sacrificial layer 220. In some cases, the first string selection line cut trench SCT1 may partially penetrate through an upper portion of the uppermost insulation layer 230 via excessive etching (i.e., over-etching).

The first string selection line cut trench SCT1 may have a tapered shape in the first direction (Z direction). A length of the first string selection line cut trench SCT1 in the second direction (X direction) may be equal to or greater than that of the uppermost sacrificial layer 220 in the second direction (X direction). Accordingly, the first string selection line cut trench SCT1 may horizontally separate the uppermost sacrificial layer 220.

Referring to FIGS. 9 and 14A through 15B, in P150, a first word line cut trench WCT1 may be formed. The formation of the first word line cut trench WCT1 may include forming a hard mask layer HDM filling the first string selection line cut trench SCT1 and then etching a stacked structure by using the hard mask layer HDM.

In more detail, referring to FIGS. 14A and 14B, the hard mask layer HDM is formed on the first and second upper insulation layers 261 and 263 to cover the first and second upper insulation layers 261 and 263. The hard mask layer HDM fills the first string selection line cut trench SCT1 of FIG. 13A.

Then, referring to FIGS. 15A and 15B, after the hard mask layer HDM is patterned, the stacked structure SS, the first and second upper substrate layers 201a and 201b, and the upper substrate sacrificial layer 202 are etched using the patterned hard mask layer HDM as an etch mask to thereby form the first word line cut trench WCT1.

After the first word line cut trench WCT1 is formed, the patterned hard mask layer HDM may be removed. According to some embodiments, the first word line cut trench WCT1 may have a tapered shape in the first direction (Z direction). According to some embodiments, a length of the first word line cut trench WCT1 in the second direction (X direction) may be greater than that of each of the sacrificial layers 220 in the second direction (X direction). Accordingly, the first word line cut trench WCT1 may horizontally separate the sacrificial layers 220 from each other.

In the related art, before word line cut trenches are formed, string selection line cut trenches are filled with an insulative material. However, in this case, sacrificial layers arranged between string selection line cut trenches filled with the insulative material are not replaced by gate insulative material layers. In addition, even when gate electrodes for string selection lines are formed and then separated from each other, it is difficult for tungsten and the like frequently used as a gate electrode material to be etched via dry etching.

According to some embodiments, after first string selection line cut trenches SCT1 are formed, the string selection line cut trenches SCT1 undergo a subsequent process without being filled with an insulative material, and thus the uppermost sacrificial layer 220 between adjacent first string selection line cut trenches SCT1 may be replaced by gate electrode material layers.

Referring to FIGS. 9 and 16, in P160, the third upper substrate layer 201c may be formed. The formation of the third upper substrate layer 201c may include removing the upper substrate sacrificial layer 202 of FIG. 15A and forming the third upper substrate layer 201c in a space formed by removing the upper substrate sacrificial layer 202.

After a word line cut liner material layer is formed in the first word line cut WLC1, a lower portion of the word line cut liner material layer is removed via an etchback process, thereby forming a word line cut liner PL. The word line cut liner PL may be a material having high etch selectivity with respect to the upper substrate sacrificial layer 202 of FIG. 15A. The sacrificial layers 220 are covered by the word line cut liner PL, but the upper substrate sacrificial layer 202 of FIG. 15A is exposed. The word line cut liner PL may be a layer for protecting the sacrificial layers 220 in a process of removing the upper substrate sacrificial layer 202 of FIG. 15A. In an example embodiment, the upper substrate sacrificial layer 202 may be removed through the first word line cut trench WCT1 using a wet etching process, for example. In this case, the upper substrate sacrificial layer 200 may have high etch selectivity with respect to the word line cut liner PL, the second upper substrate layer 201b and the first upper substrate layer 201a.

The third upper substrate layer 201c may be formed in a space formed by selective removal of the upper substrate sacrificial layer 202 of FIG. 15A. As described above, the third upper substrate layer 201c may include polysilicon doped using substantially the same method as the first and second upper substrate layers 201a and 201b. At this time, the gate insulation layer 251 on the same level as the upper substrate sacrificial layer 202 of FIG. 15A may be removed together with the upper substrate sacrificial layer 202 of FIG. 15A. Accordingly, the newly formed third upper substrate layer 201c contacts the channel layer 253. Accordingly, a charge moving path for enabling the channel structures 250 to operate as memory cells may be formed.

Moreover, because the first upper substrate layer 201a and the second upper substrate layer 201b partially contact each other, the first and second upper substrate layers 201a and 201b and the stacked structure SS arranged thereon may be prevented from collapsing. After the third upper substrate layer 201c is formed, the word line cut liner PL may be removed.

Referring to FIGS. 9, 17A, and 17B, in P170, a gate electrode material layer EML may be formed on the resulting structure of FIG. 16 after the word line cut liner PL is removed therefrom.

The gate electrode material layer EML may include a first barrier material layer, a second barrier material layer, and a gate conductive material layer corresponding to the first barrier 241 and the second barrier 242 of FIG. 4B and the gate conductive layer 243 of FIG. 4B, respectively. The first barrier material layer may include aluminum oxide, and the second barrier material layer may include aluminum nitride.

Figure 18A:
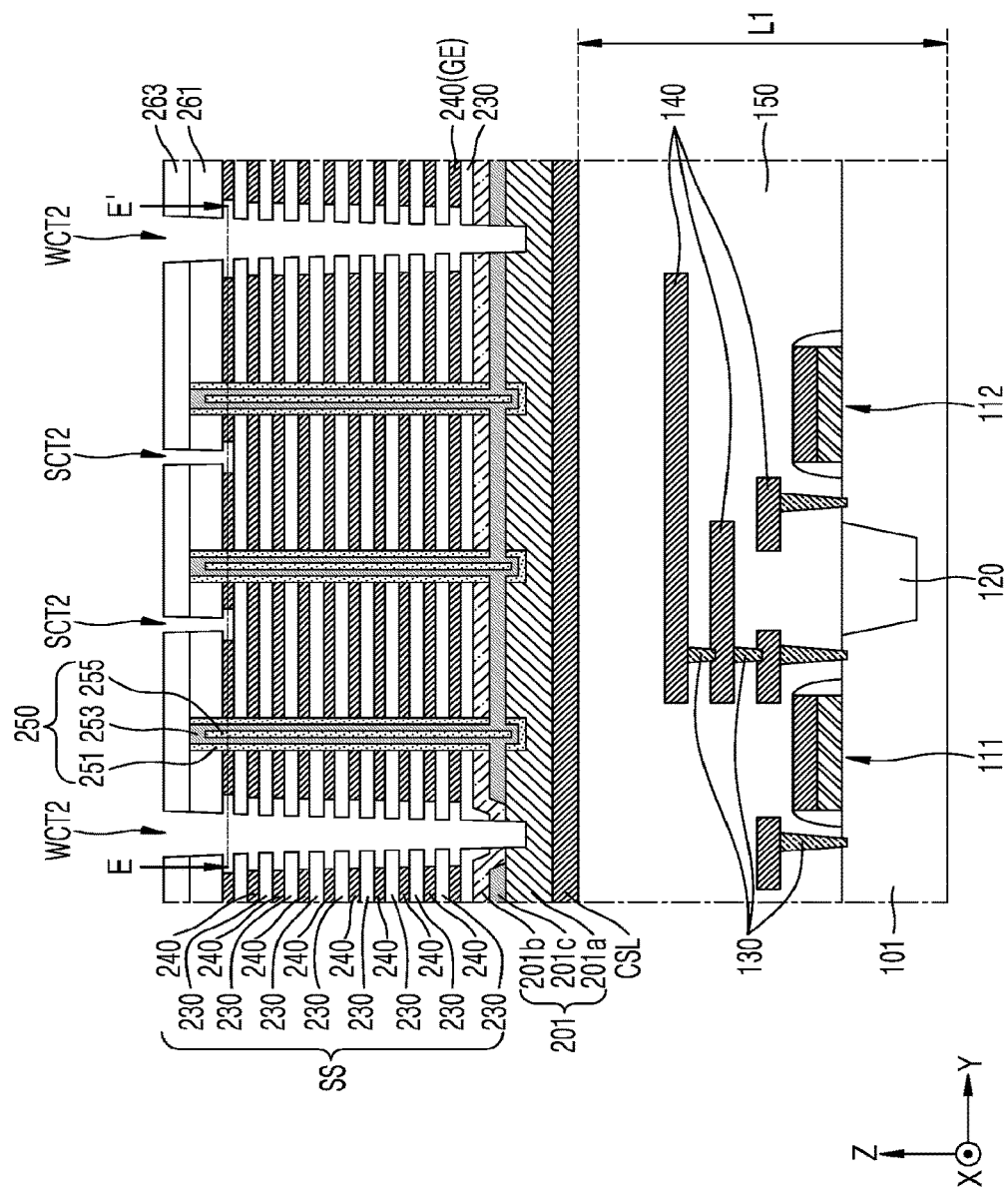
Figure 18B:
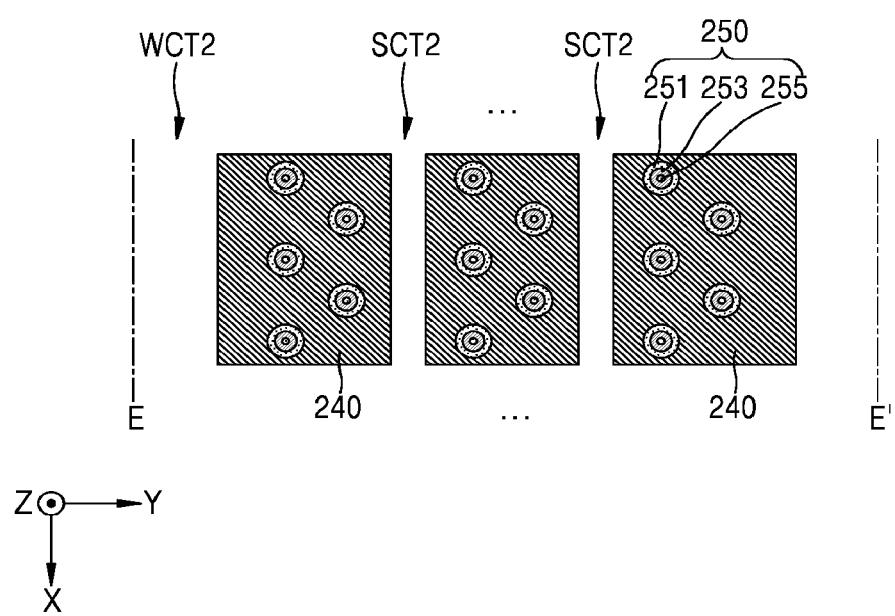

Referring to FIGS. 9, 18A, and 18B, in P180, a node separation process may be performed.

The node separation process may be a process of removing the gate electrode material layer EML of FIG. 17A, which is exposed, via wet etching. Because the first barrier material layer corresponding to the first barrier 241 of FIG. 4B is an oxide layer, the first barrier material layer may remain. Accordingly, as shown in FIG. 4B, the first barrier 241 is disposed between the first and second upper insulation layers 261 and 263 and the string selection line cut insulation layer SSLCI. However, because the second barrier material layer and the gate conductive material layer corresponding to the second barrier 242 of FIG. 4B and the gate conductive layer 243 of FIG. 4B have properties of a metal layer, the second barrier material layer and the gate conductive material layer may be removed via the node separation process. Accordingly, each of the first string selection line cut trench SCT1 and the first word line cut trench WCT1 of FIG. 15A expands in a lateral direction and thus the second string selection line cut trench SCT2 and a second word line cut trench WCT2 of FIG. 18A may be formed.

Figure 19:
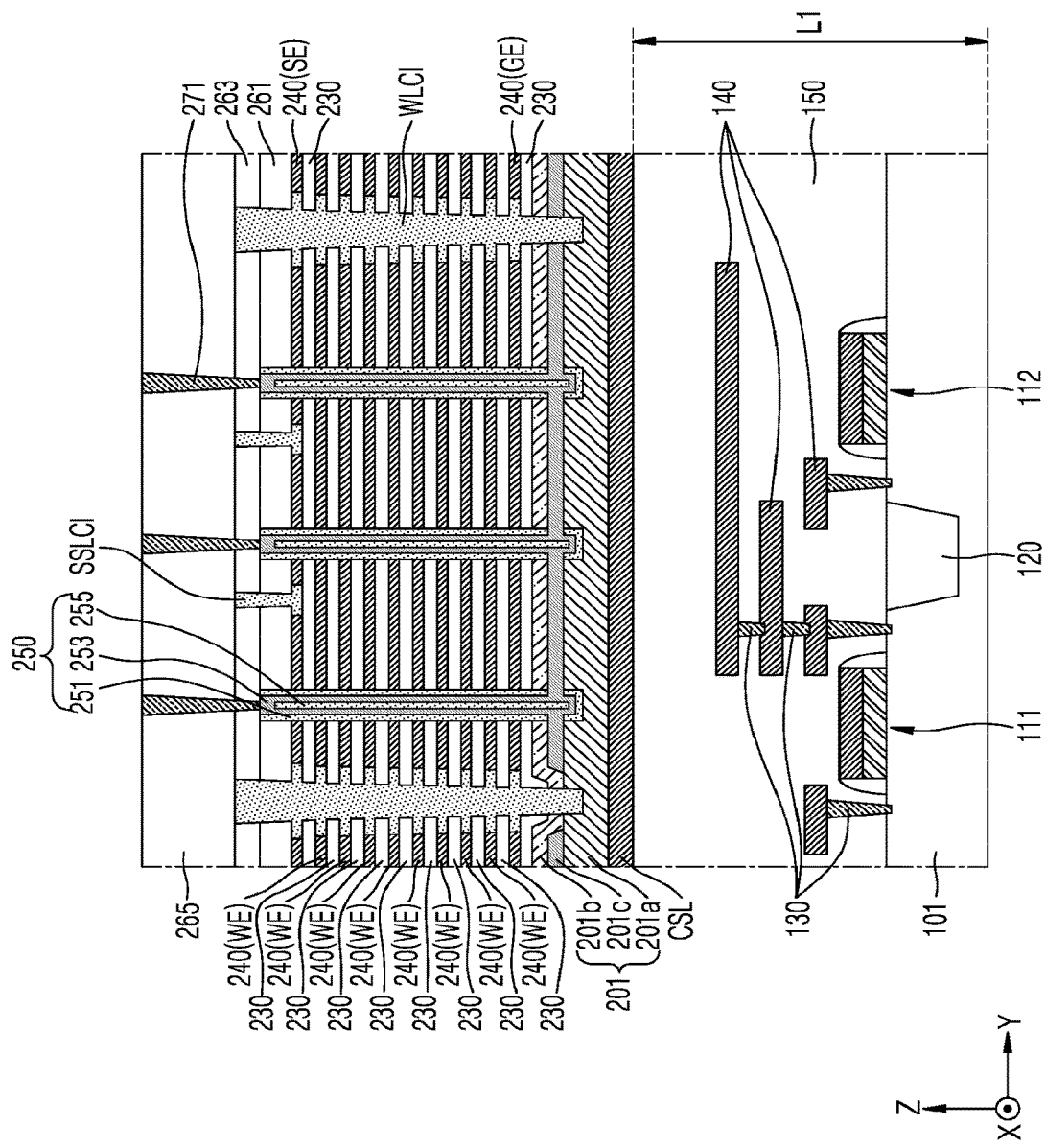

Then, referring to FIGS. 9 and 19, in P190, a selection line cut insulative material may be formed.

The selection line cut insulative material may fill the second string selection line cut trench SCT2 and the second word line cut trench WCT2 of FIG. 18A. Accordingly, the string selection line cut insulation layer SSLCI, the word line cut insulation layer WLCI, and the third upper insulation layer 265 may be formed.

According to some embodiments, after the third upper insulation layer 265 is formed, the first bit line contact vias 271 penetrating the second upper insulation layer 263 and the third upper insulation layer 265 and contacting the channel layers 253 of the channel structures 250 may be further formed.

Then, referring to FIG. 4A, the upper conductive pattern 273, the second bit line contact vias 275, and the bit line BL may be further formed. Accordingly, the semiconductor memory device 10 may be provided.

While the present inventive concept has been particularly shown and described with reference to exemplary embodiments thereof, it will be understood that various changes in form and details may be made therein without departing from the spirit and scope of the present inventive concept. Thus, the above-described embodiments should be considered in descriptive sense only and not for purposes of limitation.

What is claimed is:

1. A semiconductor memory device comprising:
a plurality of gate electrodes arranged on a substrate to be spaced apart from each other in a first direction perpendicular to an upper surface of the substrate, each of the plurality of gate electrodes being between a first word line cut insulation layer extending in the first direction and a second word line cut insulation layer adjacent to the first word line cut insulation layer and extending in the first direction;
a plurality of insulation layers arranged between the plurality of gate electrodes;
an upper insulation layer arranged on a first gate electrode which is an uppermost one of the plurality of gate electrodes, wherein the upper insulation layer is farther than the first gate electrode from the upper surface of the substrate, wherein the first gate electrode includes a first barrier in contact with the upper insulation layer, and a second barrier in contact With the first barrier and a gate conductive layer;
a plurality of channel structures penetrating through the upper insulation layer, the plurality of gate electrodes, and the plurality of insulation layers in the first direction, each of the plurality of channel structures including a plurality of layers; and
a plurality of string selection line cut insulation layers between the first word line cut insulation layer and the second word line cut insulation layer and horizontally separating the gate conductive layer of the first gate electrode into a plurality of separated gate conductive layers,
wherein the first barrier protrudes horizontally toward each of the plurality of string selection line cut insulation layers beyond a sidewall of a first portion of each of the plurality of separated gate conductive layers and extends horizontally along an upper surface of the first portion of each of the plurality of string selection line cot insulation layers.

2. The semiconductor memory device of claim 1, wherein the first barrier includes aluminum oxide.

3. The semiconductor memory device of claim 1, wherein the gate conductive layer includes tungsten.

4. The semiconductor memory device of claim 1, wherein each of the plurality of string selection line cut insulation layers is spaced apart from the upper insulation layer with the first barrier interposed therebetween.

5. The semiconductor memory device of claim 1, wherein a portion of each of the plurality of string selection line cut insulation layers that is on a same level as the upper insulation layer has a width that decreases in a direction toward the substrate.

6. The semiconductor memory device of claim 1, wherein each of the plurality of string selection line cut insulation layers includes an upper surface with a first width and a lower surface with a second width greater than the first width of the upper surface.

7. The semiconductor memory device of claim 6, wherein the second width of the lower surface is a maximum width of each of the plurality of string selection line cut insulation layers.

8. The semiconductor memory device of claim 5, wherein each of the plurality of string selection line cut insulation layers includes a first protrusion protruding toward the first gate electrode and positioned at a same level as the first gate electrode.

9. The semiconductor memory device of claim 8, wherein the first protrusion protrudes from opposite sidewalls of each of the plurality of string selection line cut insulation layers.

10. The semiconductor memory device of claim 8, wherein a thickness of the first protrusion in the first direction is less than a thickness of the first gate electrode in the first direction.

11. The semiconductor memory device of claim 8, wherein each of the plurality of string selection line cut insulation layers includes a second protrusion protruding toward a second gate electrode immediately adjacent to the first gate electrode.

12. The semiconductor memory device of claim 11, wherein each of the plurality of string selection line cut insulation layers includes a third protrusion protruding toward a third gate electrode immediately adjacent to the second gate electrode.

13. The semiconductor memory device of claim 12, wherein each of the plurality of string selection line cut insulation layers includes a fourth protrusion protruding toward a fourth gate electrode immediately adjacent to the third gate electrode.

14. The semiconductor memory device of claim 13, wherein the first protrusion protrudes farther than the second protrusion,
wherein the second protrusion protrudes farther than the third protrusion, and
wherein the third protrusion protrudes farther than the fourth protrusion.

15. A semiconductor memory device comprising:
a plurality of gate electrodes arranged on a substrate to be spaced apart from each other in a first direction perpendicular to an upper surface of the substrate, the plurality of gate electrodes comprising:
  a ground selection gate electrode arranged on the substrate,
  a plurality of word line gate electrodes arranged on the ground selection gate electrode, and
  a first string selection gate electrode arranged on the plurality of word line gate electrodes;
a plurality of insulation layers arranged between adjacent ones of the plurality of gate electrodes;
an upper insulation layer arranged on the first string selection gate electrode;
a plurality of channel structures penetrating through the upper insulation layer, the plurality of gate electrodes, and the plurality of insulation layers in the first direction, each of the plurality of channel structures including a plurality of layers;
a pair of word line cut insulation layers, wherein the plurality of gate electrodes and the plurality of insulation layers are disposed between the pair of the word line cut insulation layers spaced apart from each other in a second direction parallel to the upper surface of the substrate; and
a plurality of string selection line cut insulation layers arranged between the pair of word line cut insulation layers and horizontally separating the first string selection gated electrode in the second direction,
wherein an entire space between the plurality of string selection line cut insulation layers is filled with the first string selection gate electrode.

16. The semiconductor memory device of claim 15,
wherein the plurality of gate electrodes further comprise a second string selection gate electrode arranged between an uppermost one of the plurality of word line gate electrodes and the first string selection gate electrode, and
wherein the plurality of string selection line cut insulation layers further horizontally separate the second string selection gate electrode in the second direction.

17. The semiconductor memory device of claim 16,
wherein the plurality of gate electrodes further comprise a first dummy gate electrode arranged between the uppermost one of the plurality of word line gate electrodes and the second string selection gate electrode, and
wherein the plurality of string selection line cut insulation layers further horizontally separate the first dummy gate electrode in the second direction.

18. The semiconductor memory device of claim 17,
wherein the plurality of gate electrodes further comprise a first dummy gate electrode arranged between the uppermost one of the plurality of word line gate electrodes and the second string selection gate electrode, and
wherein the plurality of string selection line cut insulation layers further horizontally separate the first dummy gate electrode in the second direction.

19. A semiconductor memory device comprising:
a plurality of gate electrodes arranged on a substrate to be spaced apart from each other in a first direction perpendicular to an upper surface of the substrate each of the plurality of gate electrodes comprising a gate conductive layer and a first barrier layer covering the gate conductive layer;
a plurality of insulation layers arranged between the plurality of gate electrodes;
an upper insulation layer arranged on a first gate electrode, which is an uppermost gate electrode of the plurality of gate electrodes;
a plurality of channel structures penetrating through the upper insulation layer, the plurality of gate electrodes, and the plurality of insulation layers in the first direction, each of the plurality of channel structures including a plurality of layers;
a pair of word line cut insulation layers wherein the plurality of gate electrodes are disposed between the pair of the word line cut insulation layers spaced apart from each other in a second direction parallel to the upper surface of the substrate; and
a plurality of string selection line cut insulation layers arranged between the pair of word line cut insulation layers and separating the uppermost gate electrode,
wherein the first barrier layer protrudes toward the string selection line cut insulation layers farther than the gate conductive layer, and
wherein an entire space between the plurality of string selection line cut insulation layers is filled with a first string selection gate electrode.

* * * * *